(12) United States Patent
Jung et al.

(10) Patent No.: US 9,431,418 B2
(45) Date of Patent: Aug. 30, 2016

(54) VERTICAL MEMORY DEVICES AND METHODS OF MANUFACTURING THE SAME

(71) Applicants: Won-Seok Jung, Anyang-si (KR); Chang-Seok Kang, Seongnam-si (KR); Min-Yong Lee, Incheon (KR); Sang-Woo Jin, Hwasung-si (KR)

(72) Inventors: Won-Seok Jung, Anyang-si (KR); Chang-Seok Kang, Seongnam-si (KR); Min-Yong Lee, Incheon (KR); Sang-Woo Jin, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/697,655

(22) Filed: Apr. 28, 2015

(65) Prior Publication Data
US 2015/0372004 A1   Dec. 24, 2015

(30) Foreign Application Priority Data
Jun. 23, 2014   (KR) .......................... 10-2014-0076429

(51) Int. Cl.
*H01L 27/108*   (2006.01)
*H01L 29/94*   (2006.01)
*H01L 27/115*   (2006.01)

(52) U.S. Cl.
CPC ... *H01L 27/11582* (2013.01); *H01L 27/11573* (2013.01); *H01L 27/11575* (2013.01)

(58) Field of Classification Search
USPC ................. 257/314–326, E27.078, 257/E29.3–E29.309, E21.179–E21.182, 257/E21.209–E21.21, E21.422, E21.423, 257/E21.679–E21.694, 225–234, 390, 257/E27.076, E21.662, E21.666–E21.678, 257/255–266; 438/275–278; 365/149
See application file for complete search history.

(56) References Cited

U.S. PATENT DOCUMENTS

| | | | |
|---|---|---|---|
| 6,287,913 B1 | 9/2001 | Agnello et al. | |
| 6,600,173 B2 | 7/2003 | Tiwari | |
| 6,696,351 B1 | 2/2004 | Kuroda | |
| 6,753,226 B2 | 6/2004 | Tsugane et al. | |
| 6,881,621 B2 | 4/2005 | Choe et al. | |
| 6,982,466 B2 | 1/2006 | Tsugane et al. | |
| 7,095,085 B2 | 8/2006 | Goda et al. | |
| 7,387,919 B2 | 6/2008 | Kwak et al. | |
| 7,589,375 B2 * | 9/2009 | Jang | H01L 27/0688 257/316 |
| 7,592,625 B2 | 9/2009 | Park et al. | |
| 7,601,998 B2 | 10/2009 | Jang et al. | |
| 7,928,497 B2 | 4/2011 | Yaegashi | |
| 8,013,383 B2 * | 9/2011 | Kidoh | H01L 27/0688 257/324 |

* cited by examiner

*Primary Examiner* — Dao H Nguyen
*Assistant Examiner* — Tram H Nguyen
(74) *Attorney, Agent, or Firm* — Myers Bigel & Sibley, P.A.

(57) ABSTRACT

A vertical memory device and a method of manufacturing a vertical memory device are disclosed. The vertical memory device includes a substrate, a plurality of channels, a charge storage structure, a plurality of gate electrodes, a first semiconductor structure, and a protection layer pattern. The substrate includes a first region and a second region. The plurality of channels is disposed in the first region. The plurality of channels extends in a first direction substantially perpendicular to a top surface of the substrate. The charge storage structure is disposed on a sidewall of each channel. The plurality of gate electrodes is arranged on a sidewall of the charge storage structure and is spaced apart from each other in the first direction. The first semiconductor structure is disposed in the second region. The protection layer pattern covers the first semiconductor structure. The protection layer pattern has a thickness substantially similar to a thickness of a lowermost gate electrode.

20 Claims, 38 Drawing Sheets

FIG. 17
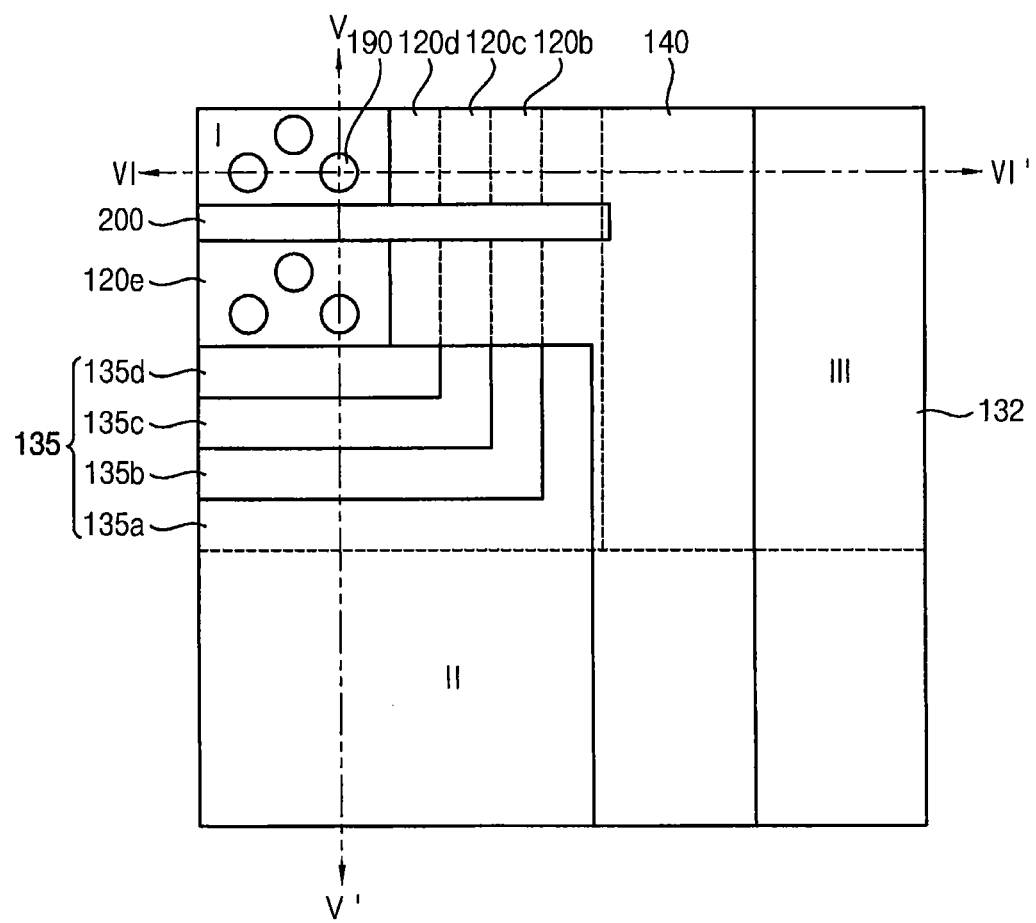
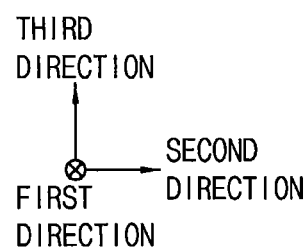

FIG. 23
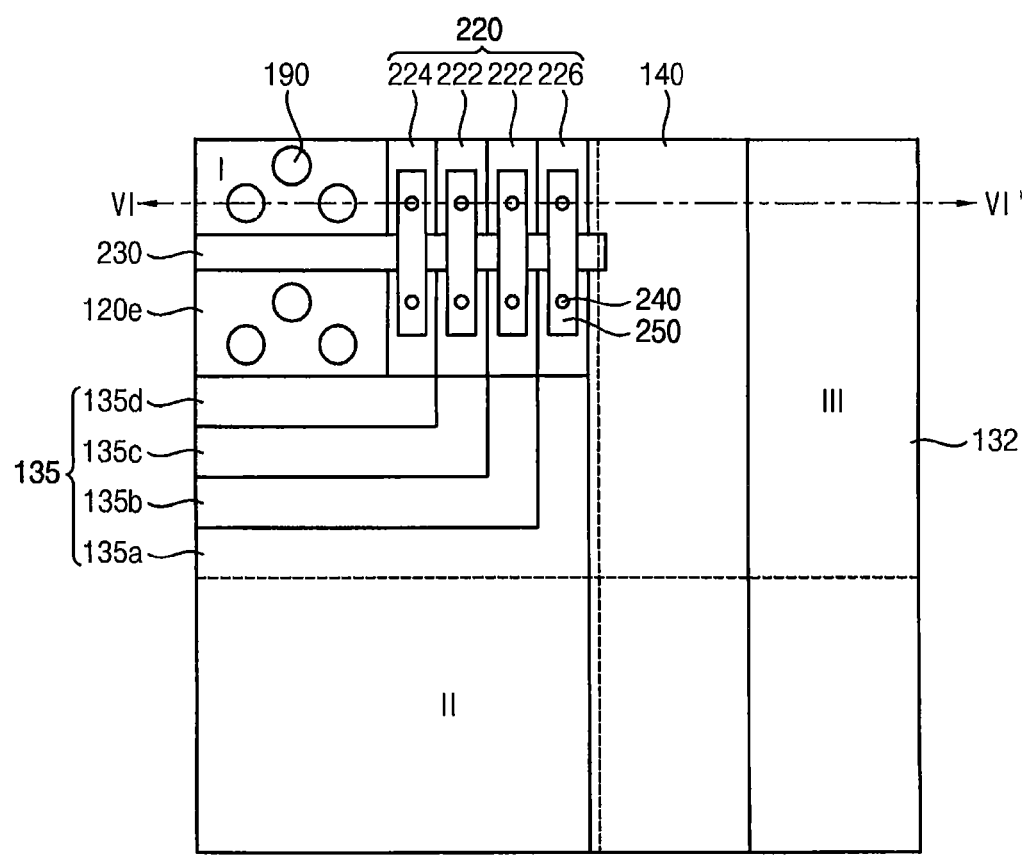
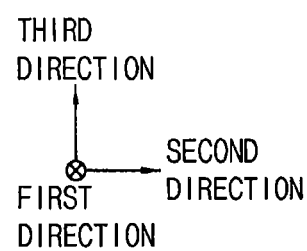

FIG. 34
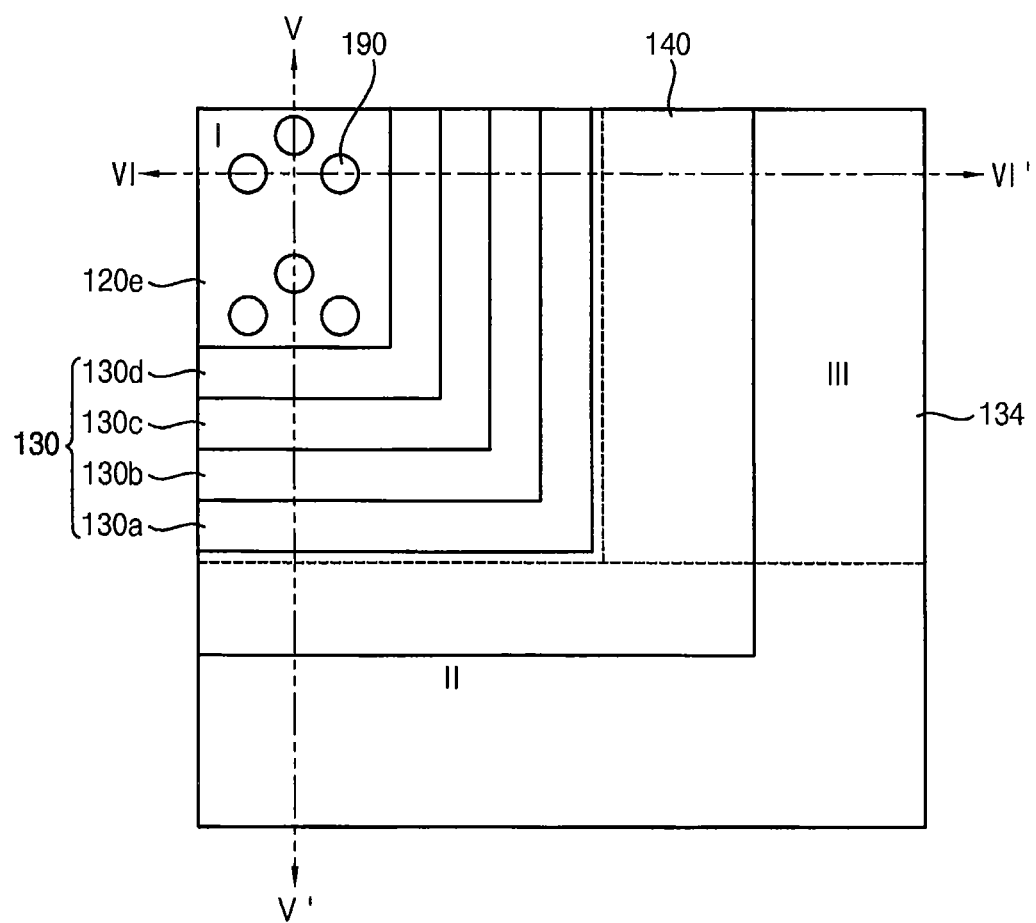
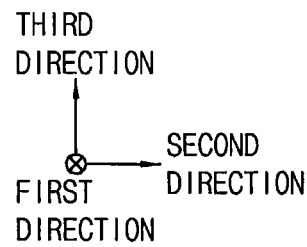

FIG. 36
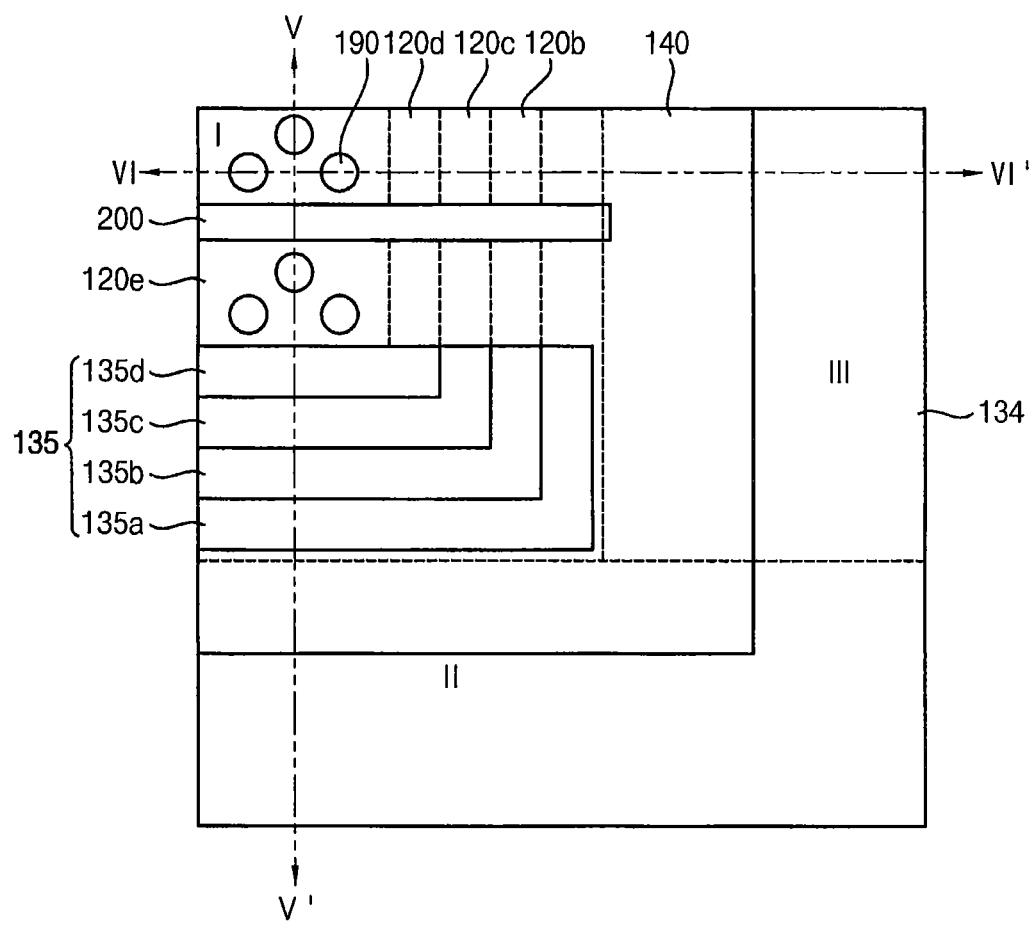
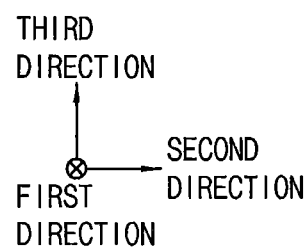

VERTICAL MEMORY DEVICES AND METHODS OF MANUFACTURING THE SAME

CROSS-REFERENCE TO RELATED APPLICATION

This application claims priority under 35 U.S.C §119 to Korean Patent Application No. 10-2014-0076429 filed on Jun. 23, 2014 in the Korean Intellectual Property Office, the disclosure of which is incorporated by reference herein in its entirety.

BACKGROUND

Recently, as memory devices become more highly integrated, a vertical memory device including a plurality of memory cells that are arranged vertically has been studied. The vertical memory device includes a pillar-shaped or a cylinder-shaped channel, a plurality of gate electrodes, and a plurality of insulation layers surrounding the channel.

The vertical memory device may include a cell region where vertical memory cells are disposed, and a peripheral region where peripheral circuits are disposed. The vertical memory cells and the peripheral circuits have different structures, so that each of the vertical memory cells and the peripheral circuits is formed separately.

SUMMARY

Some embodiments of the present inventive concepts provide a vertical memory device formed by simplified processes.

Some embodiments of the present inventive concepts provide a vertical memory device including a substrate, a plurality of channels, a charge storage structure, a plurality of gate electrodes, a first semiconductor structure, and a protection layer pattern. The substrate includes a first region and a second region. The plurality of channels is disposed in the first region. The plurality of channels extends in a first direction substantially perpendicular to a top surface of the substrate. The charge storage structure is disposed on a sidewall of each channel. The plurality of gate electrodes is arranged on a sidewall of the charge storage structure and is spaced apart from each other in the first direction. The first semiconductor structure is disposed in the second region. The protection layer pattern covers the first semiconductor structure. The protection layer pattern has a thickness substantially similar to a thickness of a lowermost gate electrode.

In some embodiments, the gate electrodes may extend in a second direction substantially parallel to the top surface of the substrate. The lowermost gate electrode and the protection layer pattern may be spaced apart from each other in the second direction. The first semiconductor structure may be spaced apart from the first region in the second direction.

In some embodiments, the vertical memory device may further comprise a plurality of remaining sacrificial layer patterns disposed at the same level as the plurality of gate electrodes respectively. A length of each remaining sacrificial layer pattern in a third direction substantially perpendicular to the first direction and the second direction may gradually decrease, as a level of each remaining sacrificial layer pattern gets higher.

In some embodiments, the vertical memory device may further comprise a second semiconductor structure disposed in the second region. The second semiconductor structure may be spaced apart from the first region in the third direction. A lowermost remaining sacrificial layer pattern may cover the second semiconductor structure.

In some embodiments, a thickness of the lowermost remaining sacrificial layer pattern may be substantially identical to the thickness of the protection layer pattern.

In some embodiments, the lowermost remaining sacrificial layer pattern and the protection layer pattern may include a same material.

In some embodiments, the vertical memory device may further comprise a second semiconductor structure disposed in the second region. The second semiconductor structure may be spaced apart from the first region in the third direction. The protection layer pattern may cover the second semiconductor structure.

In some embodiments, the remaining sacrificial layer pattern and the protection layer pattern may be spaced apart from each other in the third direction.

In some embodiments, the vertical memory device may further comprise an insulation layer pattern disposed between adjacent gate electrodes. The adjacent gate electrodes may be spaced apart from each other in the third direction.

In some embodiments, a length of the insulation layer pattern in the second direction may be greater than a length of the lowermost gate electrode in the second direction.

Some embodiments of the present inventive concepts provide a vertical memory device including a substrate, a plurality of channels, a charge storage structure, a plurality of gate electrodes, a plurality of insulating interlayers, a semiconductor structure, and a protection layer pattern. The substrate includes a first region and a second region. The plurality of channels is disposed in the first region. The plurality of channels extends in a first direction substantially perpendicular to a top surface of the substrate. The charge storage structure is disposed on a sidewall of each channel. The plurality of gate electrodes is arranged on a sidewall of the charge storage structure and is spaced apart from each other in the first direction. The plurality of insulating interlayers is arranged on a sidewall of the charge storage structure and is disposed between the adjacent gate electrodes. The semiconductor structure is disposed in the second region. The protection layer pattern covers the semiconductor structure. The protection layer pattern has a thickness substantially similar to a distance between adjacent insulating interlayers.

Some embodiments of the present inventive concepts provide a vertical memory device including a substrate, a plurality of channels, a charge storage structure, a plurality of gate electrodes, a plurality of insulating interlayers, a semiconductor structure, and a protection layer pattern. The substrate includes a first region and a second region. The plurality of channels is disposed in the first region. The plurality of channels extends in a first direction substantially perpendicular to a top surface of the substrate. The charge storage structure is disposed on a sidewall of each channel. The plurality of gate electrodes is arranged on a sidewall of the charge storage structure and is spaced apart from each other in the first direction. The plurality of remaining sacrificial layer patterns is disposed at the same level as the plurality of gate electrodes respectively. The semiconductor structure is disposed in the second region. The protection layer pattern covers the semiconductor structure. The protection layer pattern has a thickness substantially similar to a thickness of a lowermost remaining sacrificial layer pattern. A length of each remaining sacrificial layer pattern in a third direction substantially perpendicular to the first direction and the second direction gradually decreases, as a level of each remaining sacrificial layer pattern gets higher.

Some embodiments of the present inventive concepts provide methods of manufacturing a vertical memory device. In some embodiment of such methods, a first semiconductor structure is formed on a substrate including a first region and a second region. The first semiconductor structure is disposed in the second region. A plurality of sacrificial layers and a plurality of insulating interlayers are formed on the substrate alternately and repeatedly. The sacrificial layers and the insulating interlayers are partially removed to form a mold structure in the first region and the second region and a protection layer pattern in the second region simultaneously. The protection layer pattern covers the first semiconductor structure. A plurality of holes is formed through the sacrificial layers and the insulating interlayers to expose a top surface of the substrate in the first region. A charge storage structure and a channel are formed to fill each hole. The sacrificial layers are partially removed to form a plurality of gaps exposing a sidewall of each charge storage structure. A gate electrode is formed to fill each gap.

In some embodiments, after forming the charge storage structure and the channel, the insulating interlayers and the sacrificial layers may be partially removed to form an opening extending in a second direction substantially parallel to a top surface of the substrate.

In some embodiments, partially removing the sacrificial layers may include forming remaining sacrificial layer patterns in the second region. A lowermost remaining sacrificial layer pattern and the protection layer pattern may be spaced apart from each other in the second direction.

In some embodiments, before forming a plurality of sacrificial layers and a plurality of insulating interlayers, a second semiconductor device may be formed in the second region on the substrate. The first semiconductor device may be spaced apart from the first region in the second direction. The second semiconductor device may be spaced apart from the first region in a third direction substantially perpendicular to the first direction and the second direction. The lowermost remaining sacrificial layer pattern may cover the second semiconductor device.

In some embodiments, before forming a plurality of sacrificial layers and a plurality of insulating interlayers, a second semiconductor device may be formed in the second region on the substrate. The first semiconductor device may be spaced apart from the first region in the second direction. The second semiconductor device may be spaced apart from the first region in a third direction substantially perpendicular to the first direction and the second direction. The protection layer pattern may cover the second semiconductor device.

As described above, the semiconductor device may include a protection layer pattern and a lowermost remaining sacrificial layer pattern. The lowermost remaining sacrificial layer pattern and the protection layer pattern may protect a peripheral circuit in a peripheral region. The lowermost remaining sacrificial layer pattern and the protection layer pattern may be formed simultaneously. Therefore, the methods of manufacturing the vertical memory device may be simplified.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Some embodiments will be more clearly understood from the following detailed description taken in conjunction with the accompanying drawings. FIGS. 1 to 38 represent non-limiting, example embodiments as described herein.

FIG. 1 is a schematic plan view illustrating a vertical memory device in accordance with some embodiments of the present inventive concept.

FIG. 2 is an enlarged plan view illustrating region IV of FIG. 1.

FIG. 3 is a cross-sectional views cut along line VI-VI' of FIG. 2.

FIG. 4 is a cross-sectional views cut along line V-V' of FIG. 2.

FIGS. 5 to 27 are plan views and cross-sectional views illustrating methods of manufacturing a vertical memory device in accordance with some embodiments of the present inventive concept.

FIG. 28 is a plan view illustrating a vertical memory device in accordance with some embodiments of the present inventive concept.

FIG. 29 is a cross-sectional views cut along line VI-VI' of FIG. 28.

FIG. 30 is a cross-sectional views cut along line V-V' of FIG. 28.

FIGS. 31 to 37 are plan views and cross-sectional views illustrating methods of manufacturing a vertical memory device in accordance with some embodiments of the present inventive concept.

FIG. 38 is a schematic diagram illustrating an electronic system in accordance with some embodiments of the present inventive concept.

DETAILED DESCRIPTION

Figure 1:
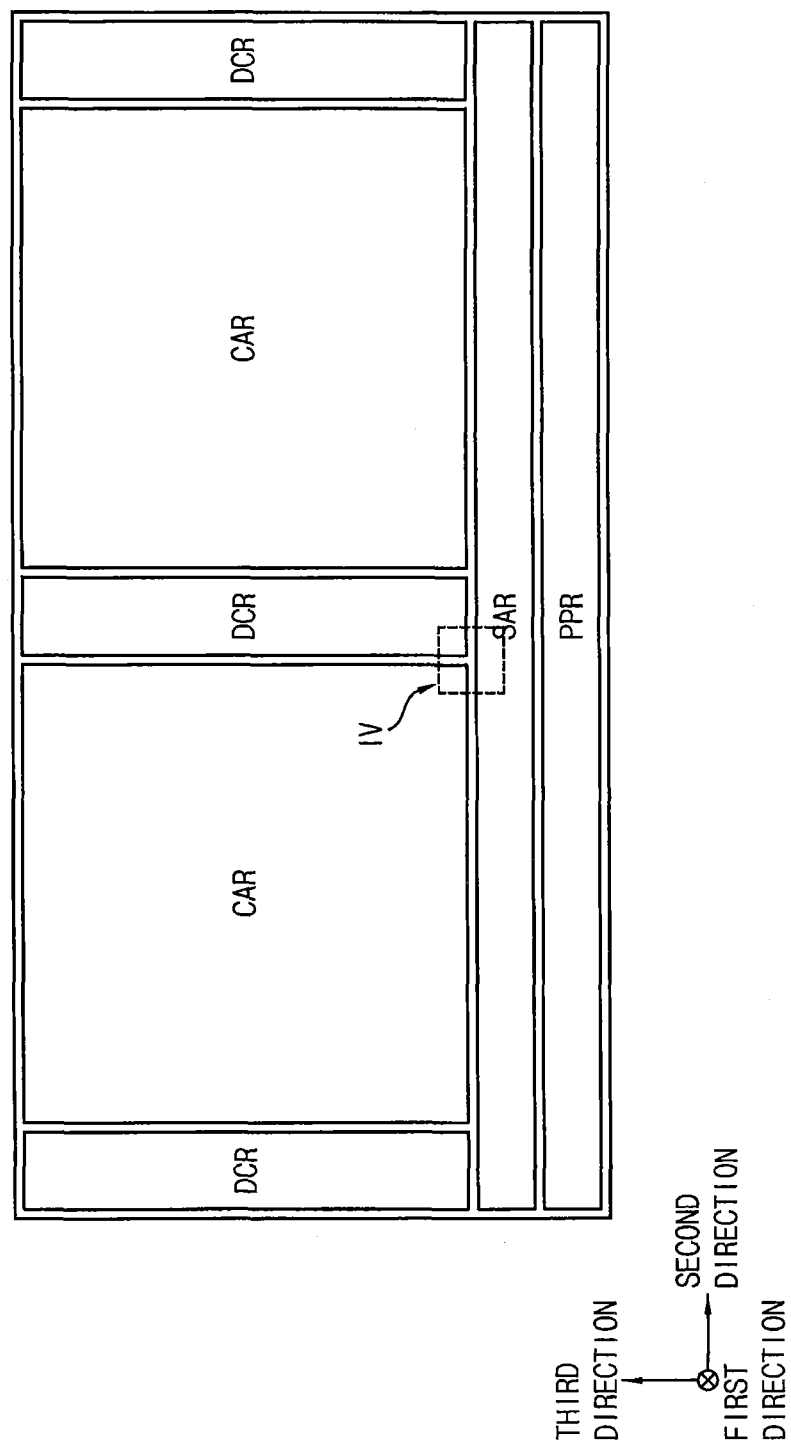

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a schematic plan view illustrating a vertical memory device in accordance with some of the present inventive concept.

Referring to FIG. 1, the vertical memory device in accordance with some embodiments may include a cell array region (CAR) and a peripheral region. Further, the peripheral region may be divided into a peripheral circuit region (PPR), a sense-amp region (SAR) and a decoding circuit region (DCR). A plurality of vertical memory cells, a plurality of bit lines and a plurality of word lines that may electrically connect the plurality of vertical memory cells may be disposed in the cell array region (CAR). Semiconductor structures, e.g., transistors of a page buffer or a voltage generator, resistors, capacitors, or other types of device elements may be disposed in the peripheral region to form various types of circuits therein. A circuit for driving the vertical memory cells may be disposed in the peripheral circuit region (PPR), and a circuit for amplify an electrical signal from the vertical memory cells may be disposed in the sense-amp region (SAR). Further, a circuit for decoding an address signal from external portion and selecting a specific bit line or a specific word line may be disposed in the decoding circuit region (DCR).

The vertical memory device may be further described with reference to FIGS. 2 to 4.

Figure 2:
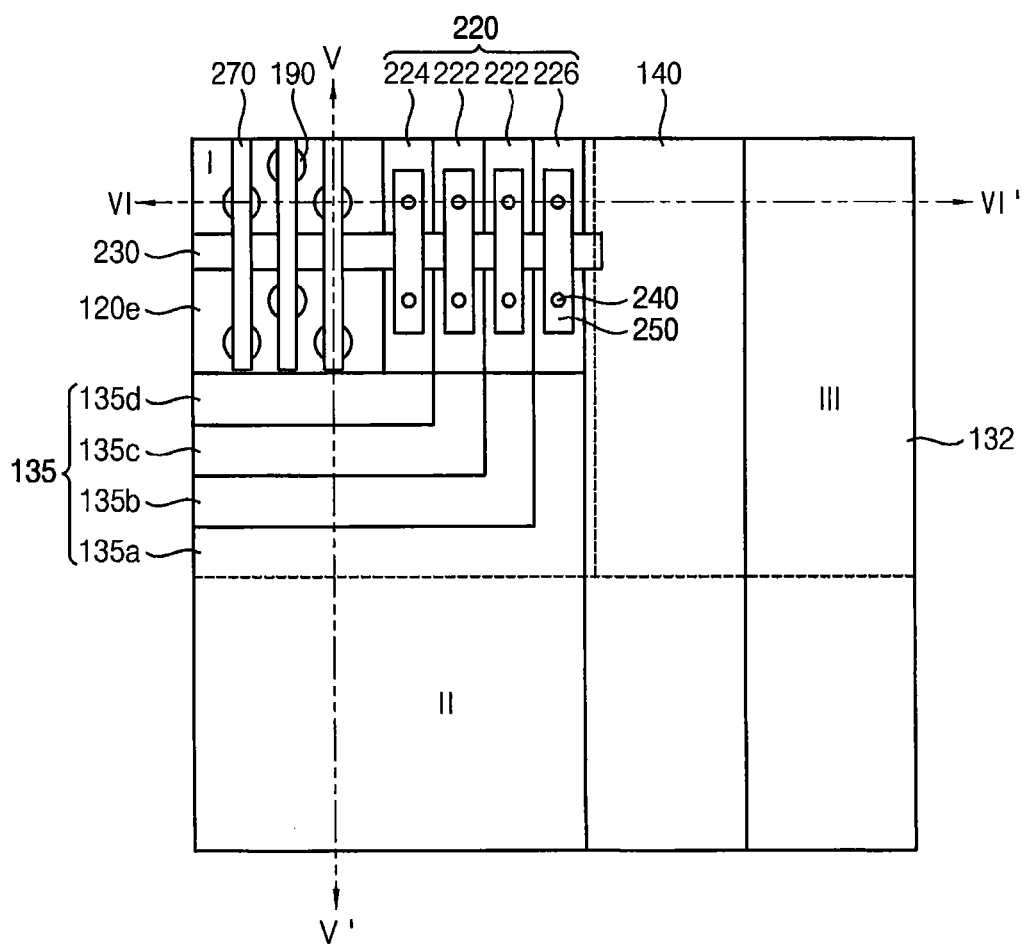
Figure 3:
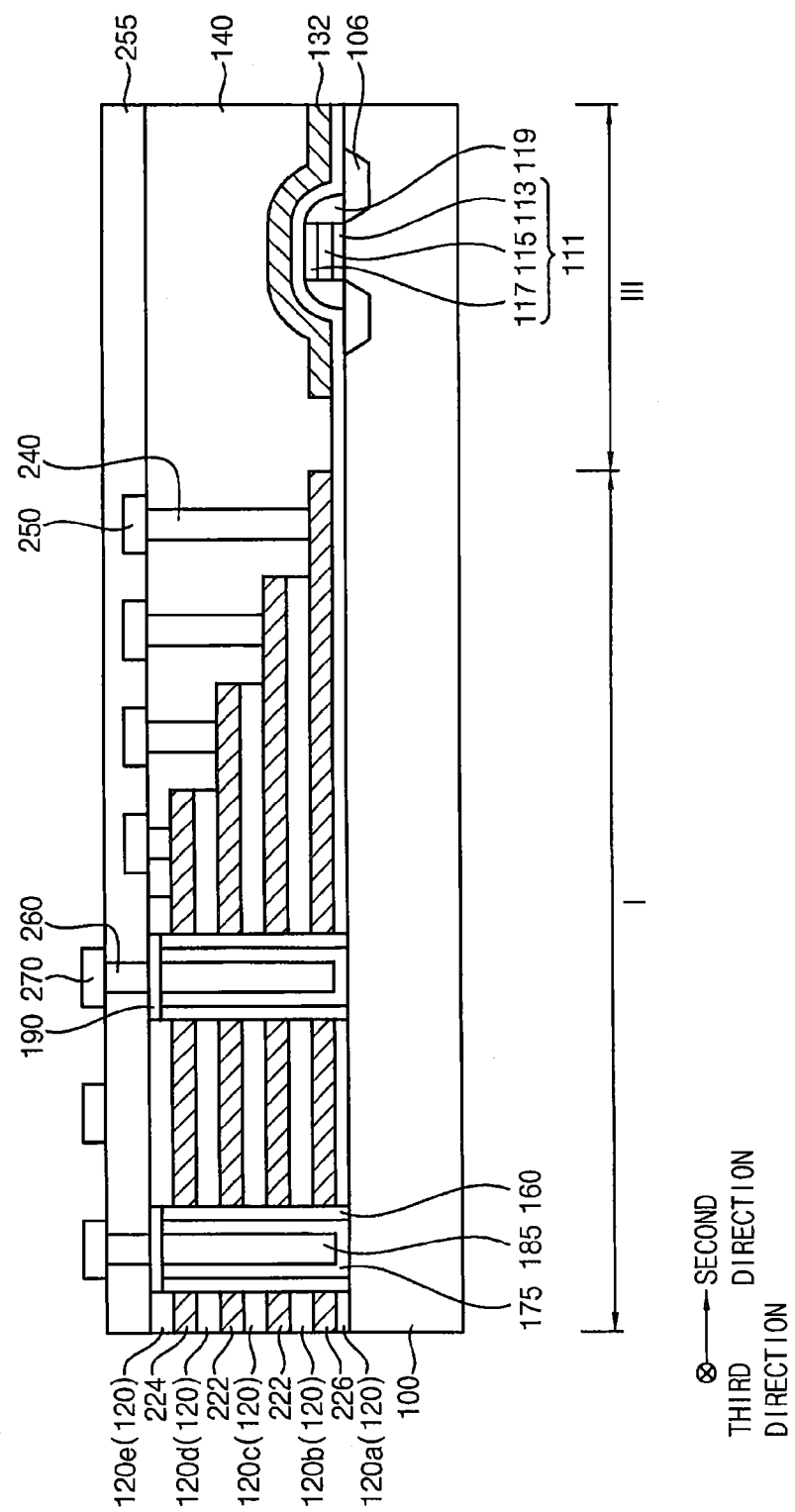
Figure 4:
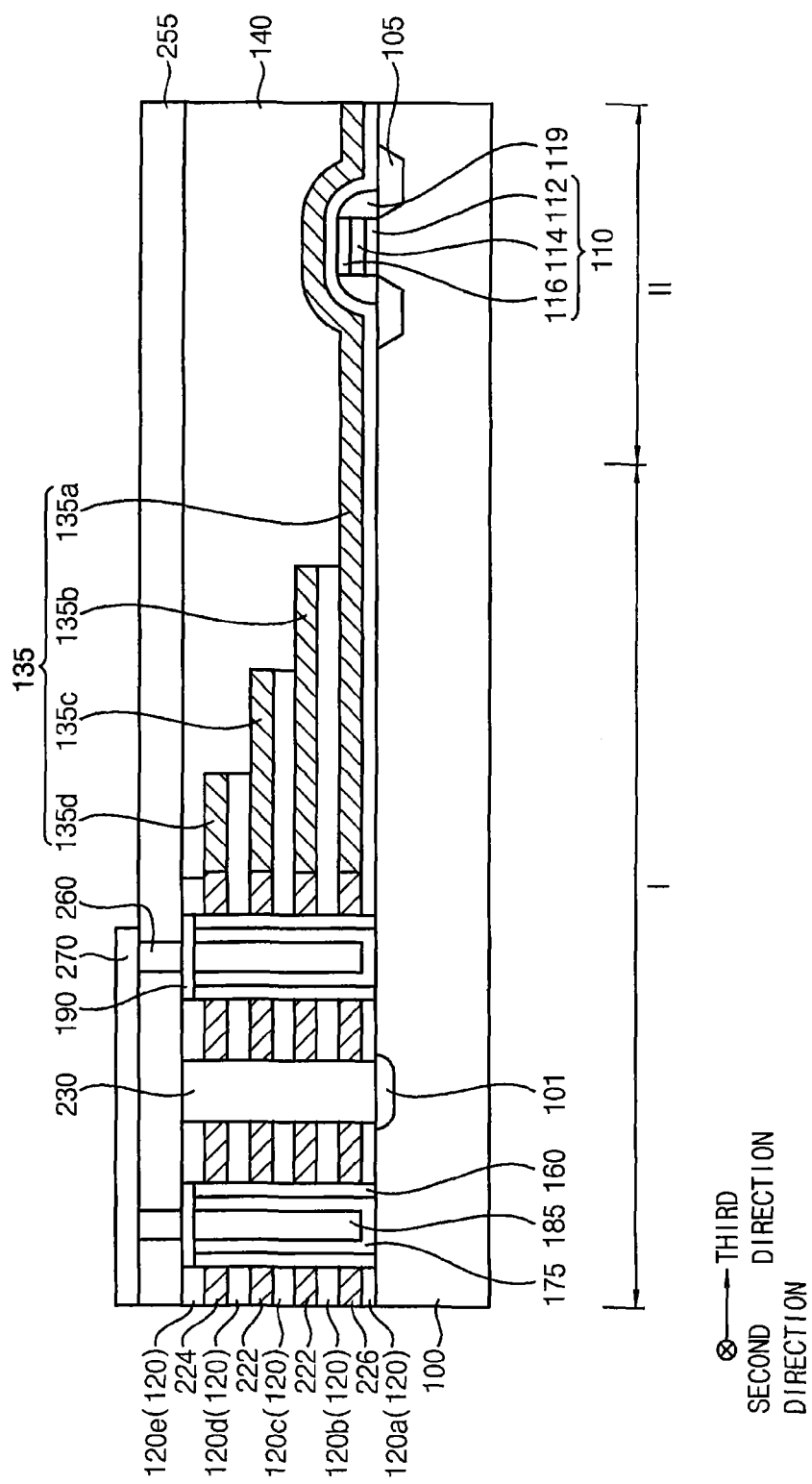

FIG. 2 is an enlarged plan view illustrating region IV of FIG. 1, FIG. 3 is a cross-sectional views cut along line VI-VI' of FIG. 2, and FIG. 4 is a cross-sectional views cut along line V-V' of FIG. 2.

In FIGS. 2 to 4, a direction substantially vertical to a top surface of a channel layer is referred to as a first direction, and two directions substantially parallel to the top surface of the channel layer and substantially perpendicular to each other are referred to as a second direction and a third direction. Additionally, a direction indicated by an arrow in the figures and a reverse direction thereto are considered to be the same direction.

Referring to FIGS. 2 to 4, the vertical memory device may include a plurality of vertical channel structures which may extend from a substrate 100 in the first direction. One of the vertical channel structures may include a channel 175, a charge storage structure 160 stacked on an outer sidewall of the channel 175 and a filling layer pattern 185 disposed inside the channel 175. The vertical memory device may further include a plurality of gate electrodes 220, which may be disposed on an outer sidewall of the charge storage structure 160, may extend in the second direction, and may be spaced apart from each other in the first direction. The vertical memory device may further include a pad 190 which may be disposed on and may contact the channel 175 and the charge storage structure 160.

The substrate 100 may include a semiconductor material, e.g., silicon, germanium, etc. For example, a p-well and/or an n-well may be disposed at an upper portion of the substrate 100.

In some embodiments, the substrate 100 may include a first region I, a second region II and a third region II. For example, the first region I may correspond to the cell array region (CAR) of FIG. 1, the second region II may correspond to the peripheral circuit region (PPR) or the sense-amp region (SAR) of FIG. 1, and the third region III may correspond to the decoding circuit region (DCR) of FIG. 1.

Each channel 175 may extend in the first direction from the first region I of the substrate 100. For example, each channel 175 may include doped and/or undoped polysilicon and/or single crystalline silicon. In some embodiments, each channel 175 may include polysilicon and/or single crystalline silicon which may be doped with p-type impurities such as boron (B).

In some embodiments, each channel 175 may have a cylinder shape or a cup shape. In this case, a space defined by an inner wall of each channel 175 may be filled with a filling layer pattern 185. In some embodiments, each channel 175 may have a pillar shape. In this case, the filling layer pattern 185 may be omitted.

The charge storage structure 160 stacked on the outer sidewall of each channel 175 may have a straw shape or a cup shape of which a central bottom is opened.

The charge storage structure 160 may include a tunnel insulation layer pattern, a charge storage layer pattern and a blocking layer pattern which may be stacked sequentially on an outer sidewall of the channel 175. In some embodiments, the tunnel insulation layer pattern may include an oxide, e.g., silicon oxide, the charge storage layer pattern may include a nitride, e.g., silicon nitride, and the blocking layer pattern may include an oxide, e.g., silicon oxide. For example, a stacking structure of the blocking layer pattern, the charge storage layer pattern and the tunnel insulation layer pattern may have an ONO (oxide-nitride-oxide) structure.

In some embodiments, a semiconductor pattern (now shown) may be formed between the top surface of the substrate 100 and a bottom surface of the channel 175. In this case, the channel 175 may be disposed on the semiconductor pattern, and charge storage structure 160 may be disposed on an edge of the top surface of the semiconductor pattern. For example, the semiconductor pattern may include doped and/or undoped polysilicon, single crystalline polysilicon, doped and/or undoped polygermanium and/or single crystalline germanium.

Further, a pad 190 may be formed on top surfaces of the channel 175, the charge storage layer structure 160 and the filling layer pattern 185. For example, the pad 190 may have a shape to cover the channel 175, the charge storage layer structure 160 and the filling layer pattern 185. For example, the pad 190 may include polysilicon and/or single crystalline silicon which may be undoped and/or doped with n-type impurities such as phosphorous (P), arsenic (As), etc.

As illustrated in FIGS. 2 to 4, a plurality of pads 190 may be arranged in the second direction, thereby forming a pad row. A plurality of pad rows may be arranged in the third direction. Further, the plurality of channels 175, the plurality of charge storage layer structures 160, and the plurality of filling layer patterns 190 may be arranged in the second direction, thereby forming a channel row that may correspond to the pad row. Further, a plurality of channel rows may be arranged in the third direction, thereby forming a channel array.

The plurality of gate electrodes 220 may be disposed on the outer sidewall of the charge storage layer structure 160. The plurality of gate electrodes 220 may be spaced apart from each other in the first direction. In some embodiments, each gate electrode 220 may extend in the second direction, such that each gate electrode 220 may surround the plurality of channels 175 of the plurality of channel rows. As illustrated in FIGS. 2 to 4, one gate electrode 220 may surround the plurality of channels 175 of two to four channel rows. In this case, the gate electrodes 220 may include a metal and/or a metal nitride. For example, the gate electrodes 220 may include a metal and/or a metal nitride with low electrical resistance (e.g., tungsten, tungsten nitride, titanium, titanium nitride, tantalum, tantalum nitride and/or platinum.). In some embodiments, the gate electrodes 220 may have a multi-layered structure including a metal layer and a barrier layer including a metal nitride.

The gate electrodes 220 may include a word line 222, a string selection line (SSL) 224 and a ground selection line (GSL) 226. The GSL 226 may be disposed to surround a lowermost portion of the channel 175, the SSL 224 may be disposed to surround an uppermost portion of the channel 175, and the word line 222 may be disposed between the GSL 226 and the SSL 224.

Each of the GSL 226, the word line 222 and the SSL 224 may be at a single level (e.g., one of each, each at a different height) or more than one level. In an example embodiments, the GSL 226 and the SSL 224 may be at one level (e.g., two of each at different heights), respectively, and the word line 222 may be at 2 levels between the GSL 226 and the SSL 224. However, the GSL 226 and the SSL 224 may be at two levels, and the word line 222 may be formed at 4, 8, 16, 32 or 64 levels.

When the semiconductor pattern (not shown) is disposed between the substrate 100 and the channel 175, the GSL 226 may extend to surround an outer sidewall of the semiconductor pattern. In this case, a gate insulation layer (not shown) may be further disposed between the GSL 226 and the outer sidewall of the semiconductor pattern.

Referring now to FIGS. 2 to 4, a length of each gate electrode 220 in the second direction may gradually decrease, as a level of each gate electrode 220 gets higher. In some embodiments, the plurality of gate electrode 220 may be stacked to have a pyramid shape or a step shape in the first direction.

Further, the remaining sacrificial layer patterns 135 may be disposed at end portions of the gate electrodes 220 in the third direction. The lowermost remaining sacrificial layer pattern 135a may be disposed at the same height as the GSL 226, the uppermost remaining sacrificial layer pattern 135d may be disposed at the same height as the SSL 224. Further, the remaining sacrificial layer pattern 135b and 135c may be disposed at the same height as the word lines 222.

A length of each remaining sacrificial layer pattern 135 in the third direction may gradually decrease, as a level of each remaining sacrificial layer pattern 135 gets higher. In example embodiments, the plurality of remaining sacrificial layer patterns 135 may be stacked to have a pyramid shape or a step shape in the first direction.

In some embodiments, the lowermost remaining sacrificial layer pattern 135a may extend in the third direction to cover the first region I and the third region III. For example, the remaining sacrificial layer patterns 135 may include a nitride, e.g., silicon nitride (SiN) and/or silicon boron nitride (SiBN).

The insulating interlayers 120 may be disposed between adjacent gate electrodes 220 in the first direction. The insulating interlayers 120 may include an oxide material such as silicon oxide (SiOx), silicon oxycarbide (SiOC) and/or silicon oxyfluoride (SiOF). The gate electrodes 220 spaced apart from each other in the first direction may be insulated by the insulating interlayers 120. In some embodiments, a plurality of insulating interlayers 120 may be stacked to have a pyramid shape or a step shape which may be substantially identical to or similar to those of the gate electrodes 220 and/or the remaining sacrificial layer patterns 135.

Accordingly, the gate electrodes 220, the remaining sacrificial layer patterns 135 and the insulating interlayers 120 may constitute a pyramid shaped stack structure.

As illustrated in FIG. 4, an insulation layer pattern 230 may be disposed between adjacent gate electrodes 220 which may be spaced apart from each other in the third direction. For example, a plurality of insulation layer patterns 230 may be arranged in the third direction, and each of the insulation layer patterns 230 may extend in the second direction. Therefore, the insulation layer patterns 230 may separate the gate electrodes 220 and the insulating interlayers 120, and the plurality of gate electrodes 220 and the insulating interlayers 120 may be defined to extend in the second direction. In this case, the insulation layer patterns 230 may serve as a word line cut pattern. For example, the insulation layer patterns 230 may include silicon oxide.

Further, a third impurity region 101 may be disposed at an upper portion of the substrate 100 below the insulation layer pattern 230. The third impurity region 101 may extend in the second direction, and may serve as a common source line (CSL). The third impurity region 101 may include n-type impurities such as phosphorous (P), arsenic (As), etc. A metal silicide pattern (not shown) such as cobalt silicide pattern or nickel silicide pattern may be electrically connected to the third impurity region 101.

A mold protection layer 140 may be disposed in the first region I, the second region II and the third region III of the substrate 100. The mold protection layer 140 may cover and surround a side portion of the pyramid shaped stack structure including the gate electrodes 220, the remaining sacrificial layer patterns 135 and the insulating interlayers 120. For example, the mold protection layer 140 may include an insulation material such as silicon oxide.

First wirings 250 may be disposed on the mold protection layer 140. For example, the first wirings 250 may transfer an electrical signal from a decoding circuit in the third region III, and may select a specific word line (that is, the gate electrode 220). Further, the first wirings 250 may be electrically connected to the gate electrodes 220 by first contacts 240 passing through the mold protection layer 140.

An upper insulation layer 255 may be disposed on the uppermost insulating interlayer 120e, the pads 190 and the mold protection layer 140 to cover the first wirings 250. Therefore, the upper insulation layer 255 may protect the pads 190. For example, the upper insulation layer 255 may include silicon oxide.

Second wirings 270 may be disposed on the upper insulation layer 255. In some embodiments, a plurality of second wirings 270 may be arranged in the second direction, and each of the second wirings 270 may extend in the third direction. For example, the second wirings 270 may serve as a bit line. Further, the second wirings 270 may be electrically connected to the pads 190 by the second contacts 260 passing through the upper insulation layer 255.

Peripheral circuits such as a driving circuit, a sense-amp and a decoding circuit may be disposed in the second region II and the third region III of the substrate 100. The peripheral circuits may include a semiconductor device such as a thin film transistor.

In some embodiments, a first gate structure 110 including a first gate insulation layer pattern 112, a first gate electrode 114 and a first gate mask 116 may be disposed in the second region II of the substrate 100. Further, a first impurity region 105 may be disposed at an upper portion of the substrate 100 adjacent the first gate structure 110. The first gate structure 110 and the first impurity region 105 may constitute a first thin film transistor. In this case, the first impurity region 105 may serve as source/drain region of the first thin film transistor. In some embodiments, a first gate spacer 118 may be further disposed on a sidewall of the first gate structure 110.

Similarly, a second gate structure 111 including a second gate insulation layer pattern 113, a second gate electrode 115 and a second gate mask 117 may be disposed in the third region III of the substrate 100. A second impurity region 106 may be disposed at an upper portion of the substrate 100 adjacent the second gate structure 111, and a second gate spacer 119 may be disposed on a sidewall of the second gate structure 111. In this case, the second gate structure 111 and the second impurity region 106 may constitute a second thin film transistor.

An additional structure for protecting the first thin film transistor and the second thin film transistor may be disposed in the second region II and the third region III of the substrate 100.

In some embodiments, the lowermost remaining sacrificial layer pattern 135a may be disposed in the second region II of the substrate 100. That is, the lowermost remaining sacrificial layer pattern 135a may cover the first gate structure 110 and the first gate spacer 118 in the second region II. Therefore, the lowermost remaining sacrificial layer pattern 135a may protect the first thin film transistor during processes for manufacturing the vertical memory device.

In some embodiments, a protection layer pattern 132 may be disposed in the third region III of the substrate 100. That is, the protection layer pattern 132 may cover the second gate structure 111 and the second gate spacer 119 in the third region III. Therefore, the protection layer pattern 132 may protect the second thin film transistor during processes for manufacturing the vertical memory device.

The protection layer pattern 132 may be disposed at the same level as the lowermost remaining sacrificial layer pattern 135a. For example, the protection layer pattern 132 and the lowermost remaining sacrificial layer pattern 135a may include the same material, and may have the same thickness. That is, a thickness of the protection layer pattern 132 may be substantially identical to or similar to a distance between the adjacent insulating interlayers 120 in the first direction. Particularly, the protection layer pattern 132 may be disposed at the same level as the GSL 226. The protection layer pattern 132 and the GSL 226 may have the same or similar thickness. The protection layer pattern 132 and the GSL 226 may be spaced apart from each other in the second direction, and the mold protection layer 140 may be disposed therebetween. Therefore, during an etching process for forming the GSL 226, the mold protection layer 140 covers the protection layer pattern 132, so that the protection layer pattern 132 may not be damaged.

According to some embodiments, the peripheral circuits may be protected by the lowermost remaining sacrificial layer pattern 135a and the protection layer pattern 132. The lowermost remaining sacrificial layer pattern 135a and the protection layer pattern 132 may be formed simultaneously.

Therefore, the method of manufacturing the vertical memory device may be simplified.

FIGS. 5 to 27 are plan views and cross-sectional views illustrating methods of manufacturing a vertical memory device in accordance with some embodiments. The figures show methods of manufacturing the vertical memory device of FIGS. 1 to 4, however, may not be limited thereto.

Figure 5:
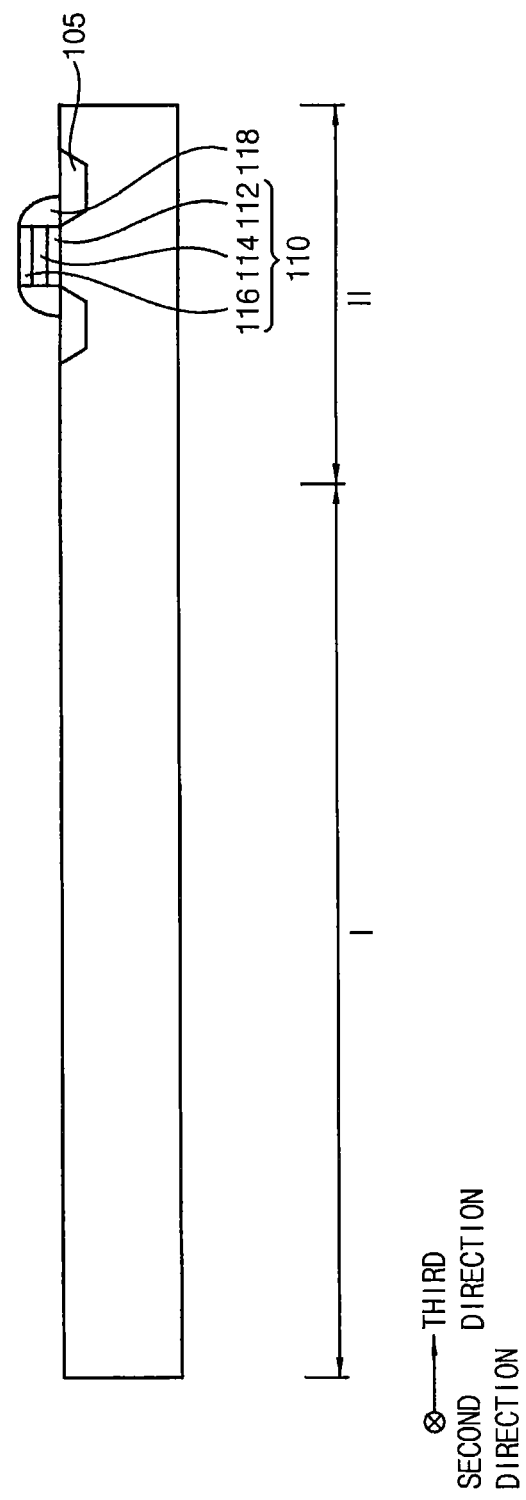

Particularly, FIGS. 7, 10, 15, 17, 23 and 25 are plan views illustrating methods of manufacturing the vertical memory device, FIGS. 5, 6, 8, 11, 12, 14, 16, 18, 20, 21 and 26 are cross-sectional views cut along the line V-V' of the plan views, and FIGS. 9, 13, 19, 22, 24 and 27 are cross-sectional views cut along the line VI-VI' of the plan views Referring to FIG. 5, a first gate structure 110 and a first impurity region 105 may be formed on a substrate 100.

The substrate 100 may include a semiconductor material, for example, silicon and/or germanium. The substrate 100 may be divided into a first region I, a second region II and a third region III. In some embodiments, the first region I may correspond to the cell array region (CAR) of FIG. 1, the second region II may correspond to the peripheral circuit region (PPR) or the sense-amp region (SAR) of FIG. 1, and the third region III may correspond to the decoding circuit region (DCR) of FIG. 1.

The first gate structure 110 and the first impurity region 105 may be formed in the second region II of the substrate 100. For example, a gate insulation layer, a gate electrode layer and a gate mask layer may be sequentially formed on the substrate 100. The gate mask layer may be partially removed to form a first gate mask 116, and the gate electrode layer and the gate insulation layer may be partially removed by using the first gate mask 116 as an etching mask, thereby forming a first gate electrode 114 and a first gate insulation layer pattern 112. Therefore, the first gate structure 110 may be formed to include the first gate insulation layer pattern 112, the first gate electrode 114 and the first gate mask 116.

The gate insulation layer may be formed using a silicon oxide and/or a metal oxide. The gate electrode layer may be formed using a metal, a metal nitride and/or a doped polysilicon. The gate mask layer may be formed using a silicon nitride. The gate insulation layer, the gate electrode layer and the gate mask layer may be formed by a chemical vapor deposition (CVD) process, a plasma enhanced chemical vapor deposition (PECVD) process, a high density plasma chemical vapor deposition process (HDP-CVD), an atomic layer deposition (ALD) process and/or a sputtering process. The gate insulation layer may be formed by oxidizing an upper surface of the substrate 100.

Further, the first impurity region 105 may be formed at an upper portion of the substrate 100 by implanting impurities using the first gate structure 110 as an ion implantation mask. The first gate structure 110 and the first impurity region 105 may constitute a first thin film transistor in the second region II.

In some embodiments, a spacer layer is formed on the substrate 100 to cover the first gate structure 110, and then the spacer layer may be anisotropically removed to form a first gate spacer 118 on a sidewall of the first gate structure 110.

A second gate structure 111 (See FIG. 9) and a second impurity region 106 (See FIG. 9) may be formed in the third region III of the substrate 100. The second gate structure 111 may include a second gate insulation layer pattern 113 (See FIG. 9), a second gate electrode 115 (See FIG. 9) and a second gate mask 117 (See FIG. 9), and a second gate spacer 119 (See FIG. 9) may be formed on a sidewall of the second gate structure 111.

In some embodiments, the first gate structure 110 and the second gate structure 111 may be formed simultaneously, and the first impurity region 105 and the second impurity region 106 may be formed simultaneously.

Figure 6:
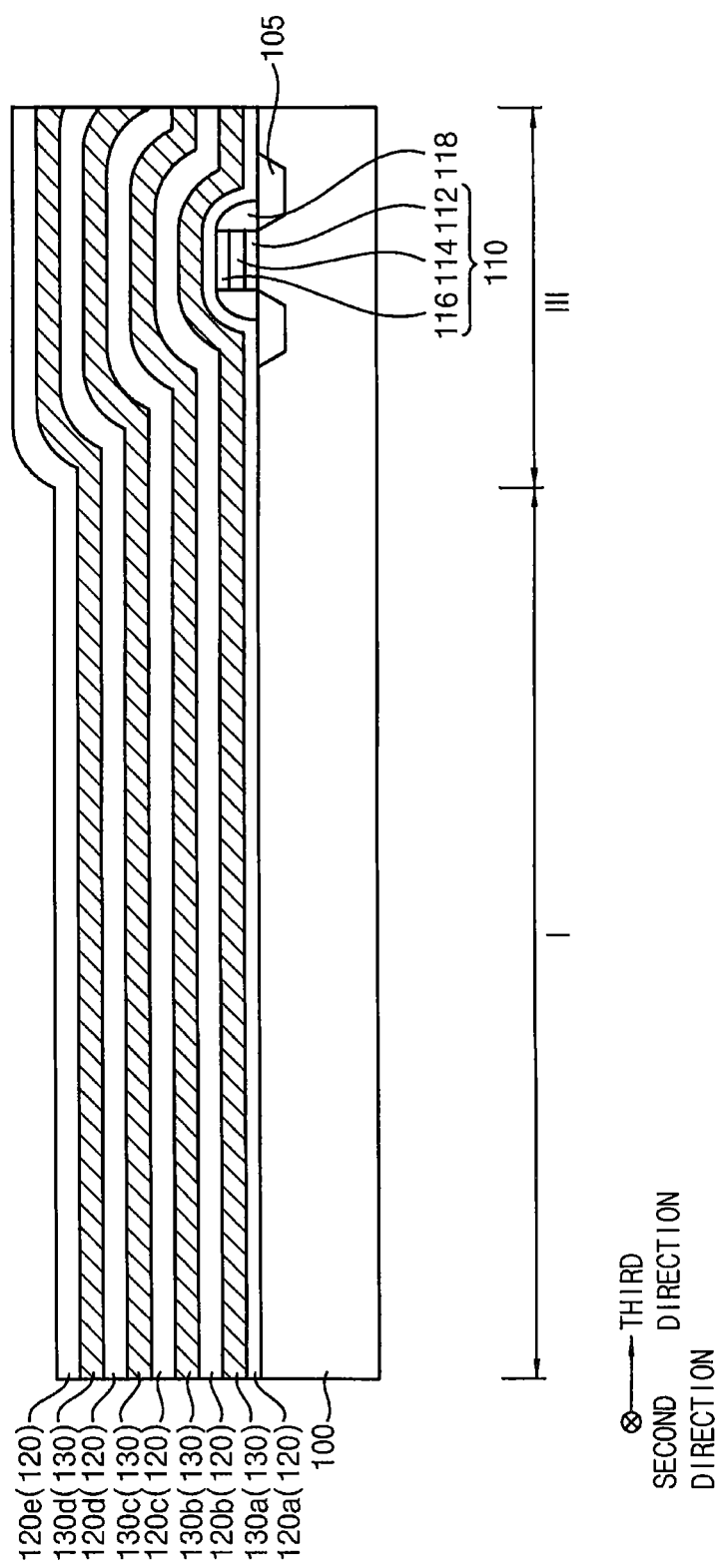

Referring to FIG. 6, a plurality of insulating interlayers 120 and a plurality of the sacrificial layers 130 may be formed on the substrate 100 alternately and repeatedly, thereby forming a mold structure.

In some embodiments, the insulating interlayers 120 may be formed using an oxide material such as silicon oxide (SiOx), silicon oxycarbide (SiOC) and/or silicon oxyfluoride (SiOF). The sacrificial layers 130 may be formed using a material with etch selectivity to the insulating interlayers 120 and with a relatively high etch rate. For example, the sacrificial layers 130 may be formed using a nitride, e.g., silicon nitride (SiN) and/or silicon boron nitride (SiBN).

The insulating interlayers 120 and the sacrificial layers 130 may be formed by, for example, a CVD process, a PECVD process and/or an ALD process. A lowermost insulating interlayer 120a, which may be formed directly on a top surface of the substrate 100, may be formed by, for example, a thermal oxidation process. In this case, the lowermost insulating interlayer 120a may be thinner than other insulating interlayers 120b, 120c, 120d and 120e.

The sacrificial layers 130 will be removed later to provide a space for receiving GSL 226, word line 222 and SSL 224 (See FIG. 22).

The number of the insulating interlayers 120 and the number of the sacrificial layers 130 stacked on the substrate 100 may vary according to the desired number of the GSL 226, the word line 222 and the SSL 224. According to some embodiments, each of the GSL 226 and the SSL 224 may be formed at a single level, and the word line 222 may be formed at 4 levels. The sacrificial layers 130 may be formed at 6 levels, and the insulating interlayers 120 may be formed at 7 levels. According to some embodiments, each of the GSL 226 and the SSL 224 may be formed at two levels, and the word line 222 may be formed at 2, 8, 16, 32 or 64 levels. The number of the insulating interlayers 120 and the number of the sacrificial layers 130 may vary according to this case. However, the number of GSLs 226, SSLs 224 and word lines 222 may not be limited herein.

Figure 7:
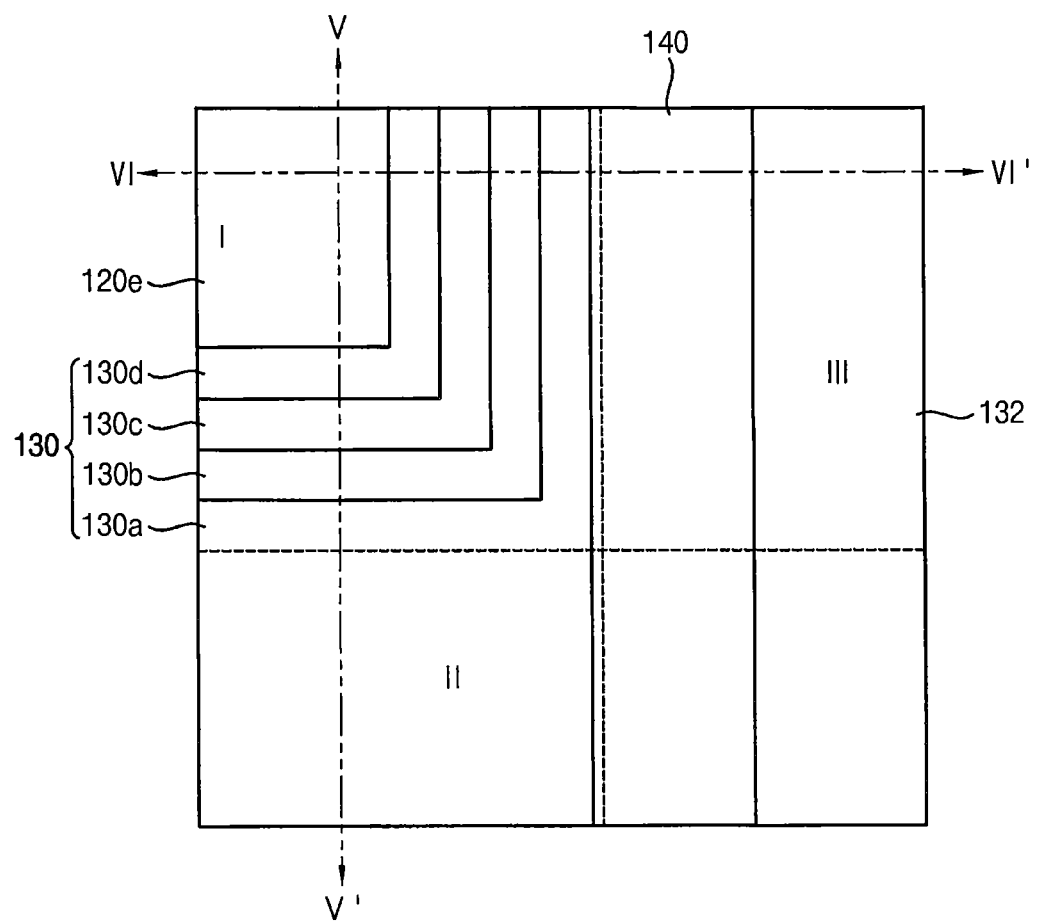
Figure 8:
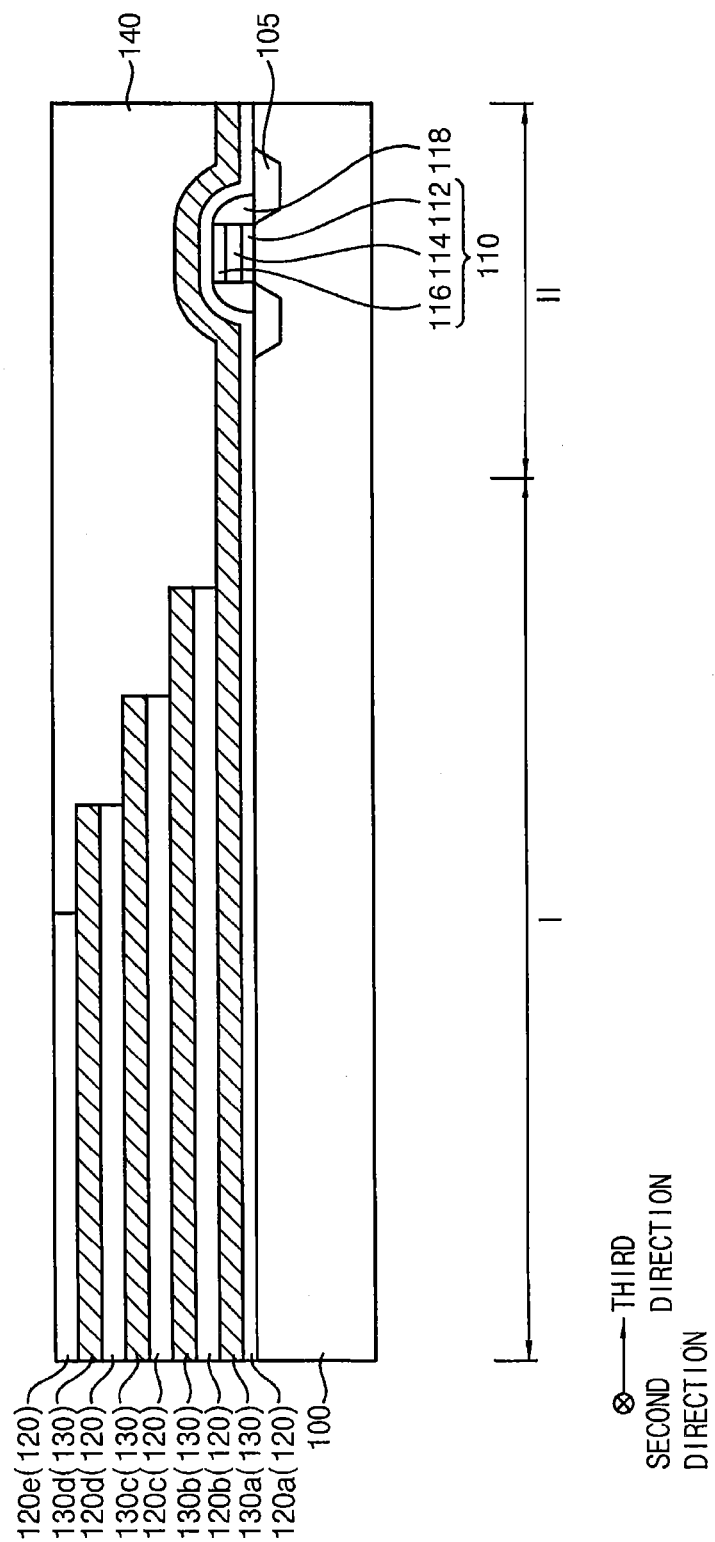
Figure 9:
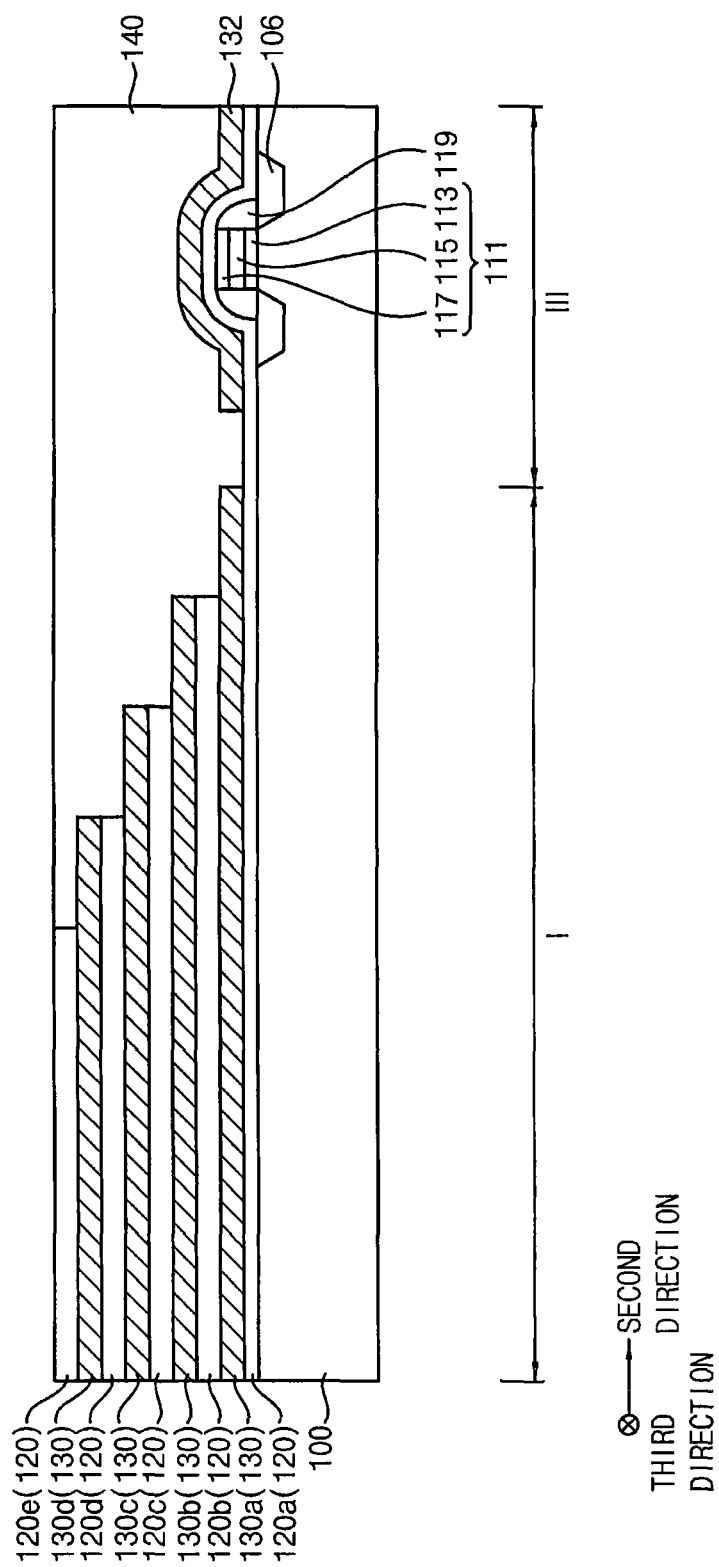

Referring to FIGS. 7 to 9, the insulating interlayers 120 and the sacrificial layers 130 may be partially removed to form a pyramid shaped mold structure.

In some embodiments, a photoresist pattern (not shown) may be formed on an uppermost insulating interlayer 120e, and end portions of the insulating interlayers 120e, 120d, 120c and 120b and the sacrificial layers 130d, 130c, 130b and 103a may be removed by using the photoresist pattern as an etching mask. Then, end portion of the photoresist pattern may be removed to reduce a width of the photoresist pattern, and end portions of the insulating interlayers 120e, 120d and 120c and the sacrificial layers 130d, 130c and 130b may be removed by using the photoresist pattern as an etching mask. The above described etching process may be repeated to form the pyramid shaped mold structure.

In some embodiments, the insulating interlayers 120b, 120c, 120d and 120e except for a lowermost insulating interlayer 120a and the sacrificial layers 130b, 130c and 130d except form a lowermost insulating interlayer 130a may be removed in the second region II and the third region III.

However, the lowermost insulating interlayer 120a and the lowermost sacrificial layer 130a may remain in the second region II or the third region III. In some embodiments, the lowermost sacrificial layer 130a may be partially removed, so that the lowermost sacrificial layer 130a may extend in the third direction from the first region I to the second region II and a protection layer pattern 132 may be spaced apart from the lowermost sacrificial layer 130a in the second direction, and may be disposed in the third region. Therefore, the lowermost sacrificial layer 130a may cover the first gate structure 110 (that is, the first thin film transistor) in the second region II, and the protection layer pattern 132 may cover the second gate structure 111 (that is, the second thin film transistor) in the third region III. That is, the lowermost sacrificial layer 130a and the protection layer pattern 132 may serve to protect the peripheral circuits in the second region II and the third region III.

In some embodiments, the protection layer pattern 132 may be formed simultaneously during deposition processes and etching processes for forming the lowermost sacrificial layer 130a. Therefore, the methods of manufacturing the vertical memory device may be simplified.

After forming the pyramid shaped mold structure, a mold protection layer 140 may be formed to cover and surround a side portion of the pyramid shaped mold structure. For example, an insulation layer may be formed to cover the pyramid shaped mold structure by a CVD process or a spin coating process using silicon oxide. Then, an upper portion of the insulation layer may be planarized, until a top surface of the uppermost insulating interlayer 120e is exposed, thereby forming the mold protection layer 140. The planarization process may include a chemical mechanical polish (CMP) process or an etch-back process.

In some embodiments, the mold protection layer 140 and the insulating interlayers 120 may include similar material or the same material. In this case, the mold protection layer 140 may be integrally formed with the insulating interlayers 120.

Figure 10:
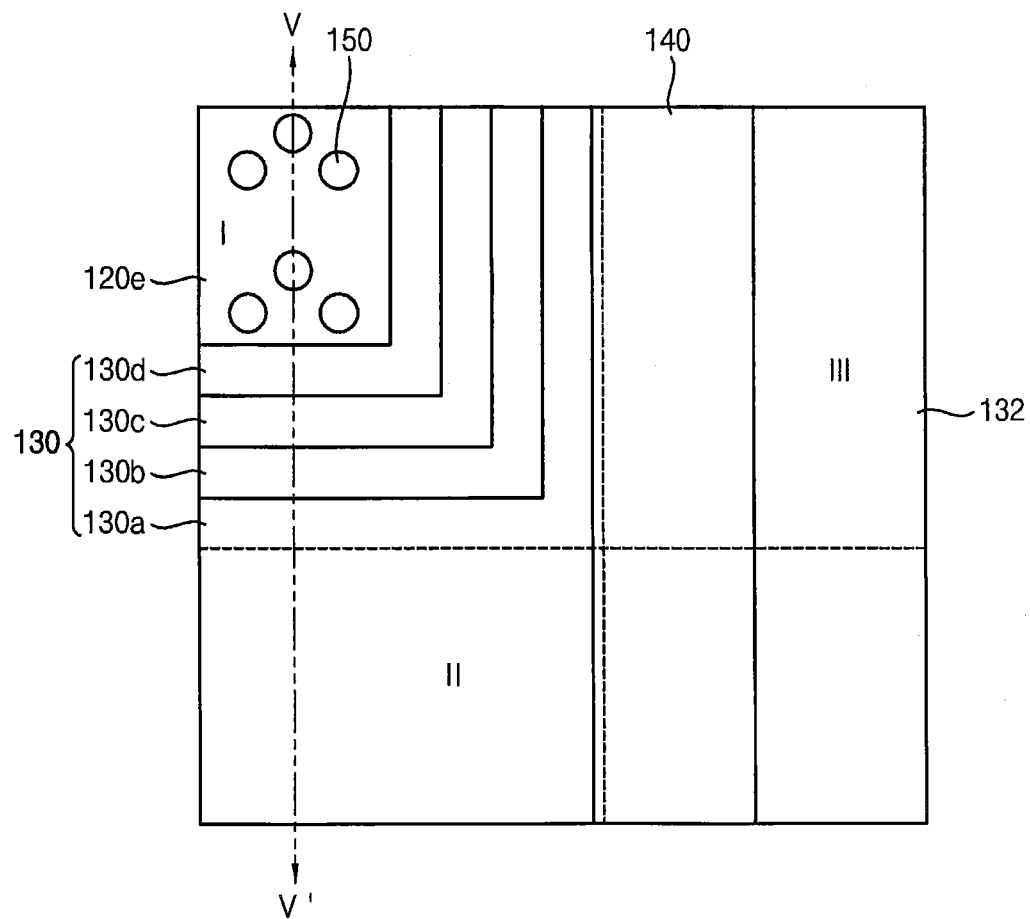
Figure 11:
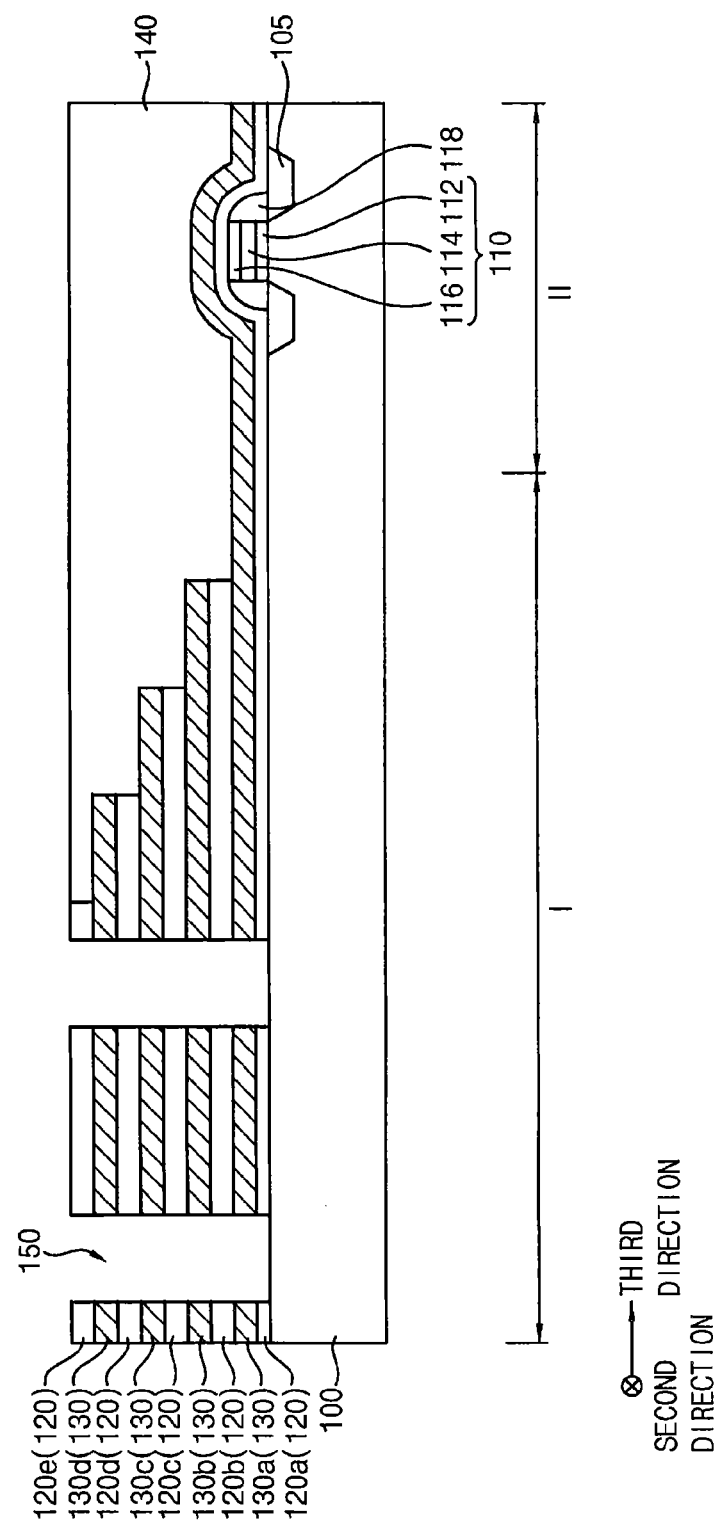

Referring to FIGS. 10 and 11, a plurality of channel holes 150 may be formed through the insulating interlayers 120 and the sacrificial layers 130.

After forming a hard mask on the uppermost insulating interlayer 120e, the insulating interlayers 120 and the sacrificial layers 130 may be dry etched using the hard mask as an etch mask to form the channel holes 150. The channel holes 150 may extend in the first direction from a top surface of the substrate 100, and the top surface of the substrate 100 may be exposed by the channel holes 150 in the first region I. The hard mask may be formed using silicon based and/or carbon-based spin on hard mask (SOH) material and/or a photoresist material.

As illustrated in FIG. 10, a plurality of channel holes 150 may be arranged in the second direction, thereby forming a channel hole row, and a plurality of channel hole rows may be arranged in the third direction, thereby forming a channel hole array. In some embodiments, the plurality of channel holes 150 may be arranged in a zigzag pattern with respect to the third direction.

After forming the channel holes 150, the hard mask may be removed by an ashing process and/or a strip process.

Figure 12:
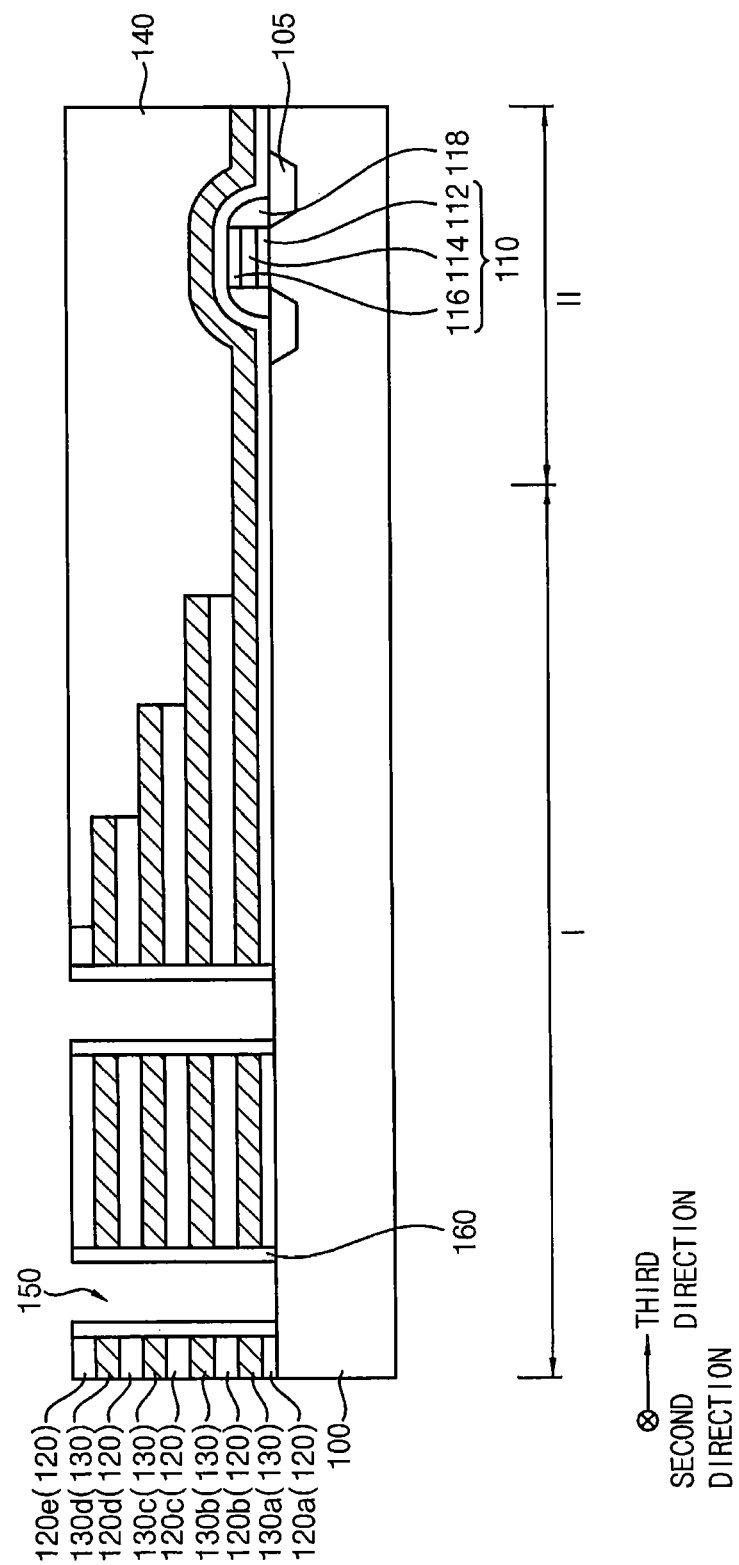

Referring to FIG. 12, a charge storage structure 160 may be formed on a sidewall of the channel hole 150.

The charge storage structure 160 may include a plurality of dielectric layer patterns which may be stacked sequentially. For example, a blocking layer, a charge storage layer and a tunnel insulation layer may be sequentially formed on the top surface of the substrate 100, a sidewall of the channel holes 150, a top surface of the uppermost insulating interlayer 120e and a top surface of the mold protection layer 140. Then upper portions of the blocking layer, the charge storage layer and the tunnel insulation layer on the top surface of the substrate 100, the top surface of the uppermost insulating interlayer 120e and the top surface of the mold protection layer 140 may be removed to form the charge storage structure 160. Therefore, the charge storage structure 160 may be disposed on the sidewall of the channel hole 150. The charge storage structure 160 may have a straw shape or a cup shape of which a central bottom is opened.

In some embodiments, the tunnel insulation layer may be formed using an oxide, e.g., silicon oxide, the charge storage layer may be formed using a nitride, e.g., silicon nitride, and the first blocking layer may be formed using an oxide, e.g., silicon oxide. For example, the charge storage structure 160 may have an ONO structure. The blocking layer, the charge storage layer and the tunnel insulation layer may be formed by a CVD process, a PECVD process or an ALD process.

Figure 13:
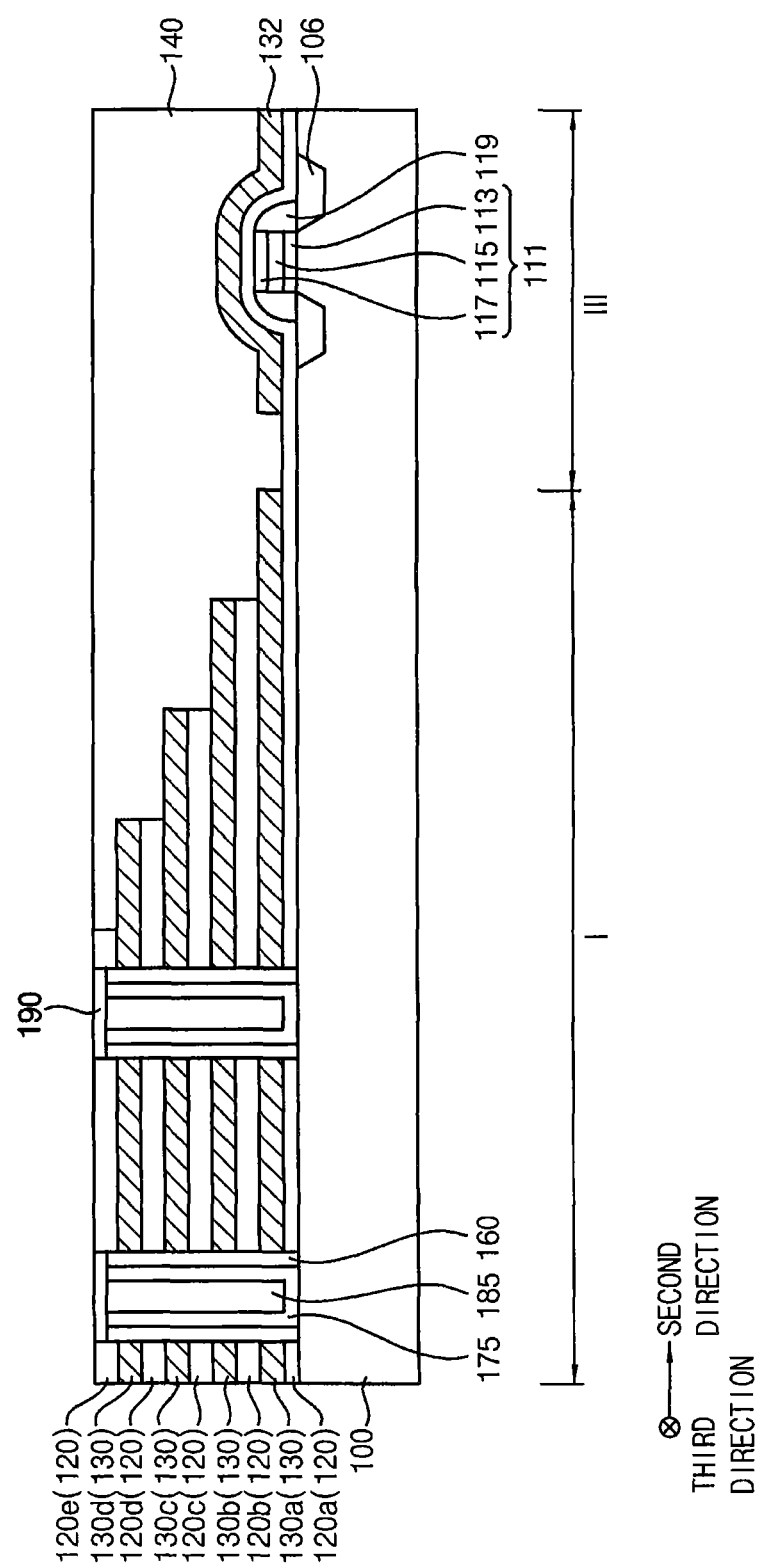
Figure 14:
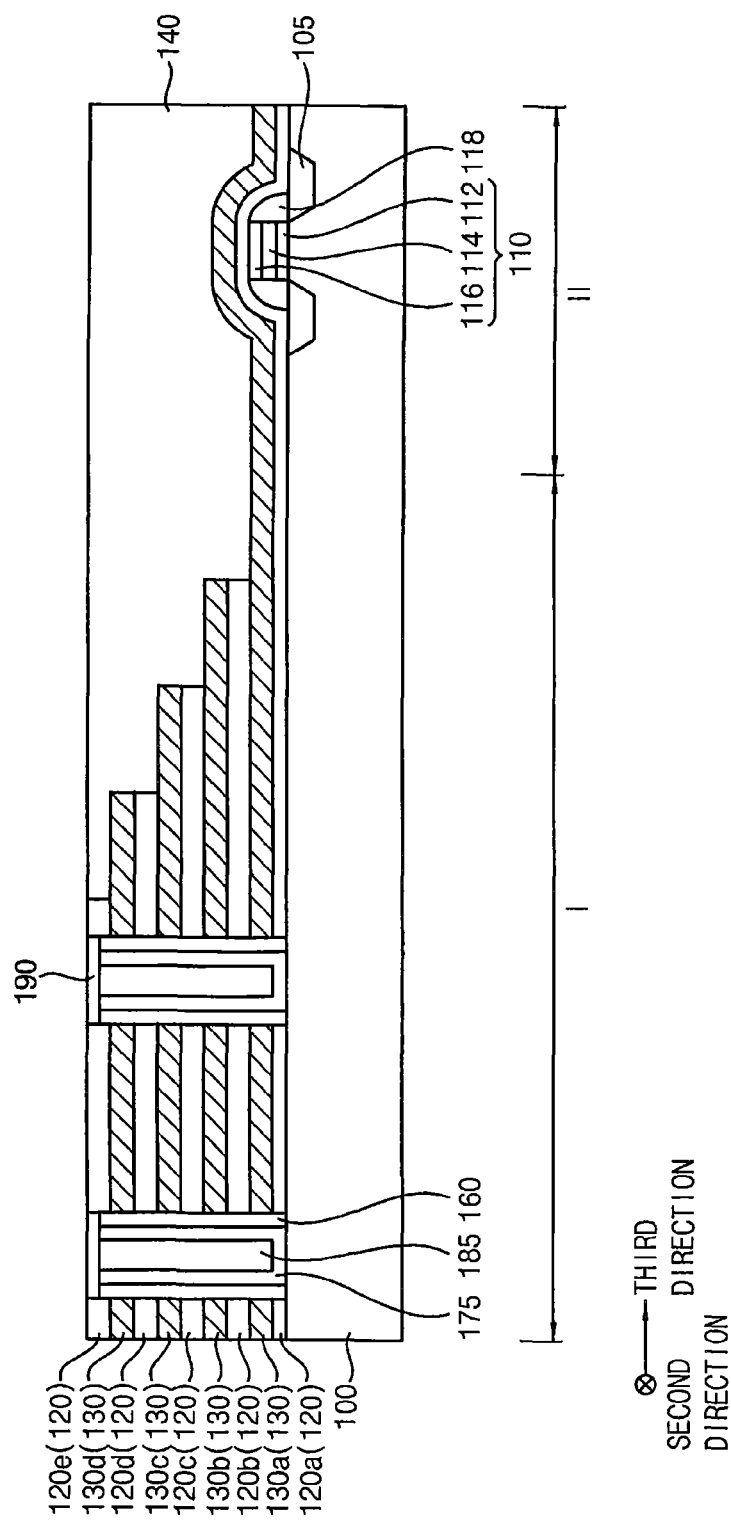

Referring to FIGS. 13 and 14, a plurality of channels 175, a plurality of filling layer patterns 185 and a plurality of pads 190 may be formed to fill the plurality of channel holes, respectively.

A channel layer may be formed on the uppermost insulating interlayer 120e, the charge storage structure 160 and a top surface of the substrate 100 exposed by the channel holes 150, a filling layer may be formed on the channel layer to fill the remaining portion of the channel holes 150. Then, the channel layer and the filling layer may be planarized, until a top surface of the uppermost insulating interlayer 120e is exposed. So that, the charge storage structure 160, the channel 175 and the filling layer pattern 185 may fill the channel hole 150.

The channel 175 may have a cup shape, and the filling layer pattern 185 may have a pillar shape. The charge storage structure may include a tunnel insulation layer pattern, a charge storage layer pattern, and a blocking layer pattern.

In some embodiments, the channel layer may be formed using doped and/or undoped polysilicon and/or single crystalline silicon. In some embodiments, a preliminary channel layer may be formed using polysilicon and/or amorphous silicon, and then the preliminary channel layer may be crystallized by a thermal process or a laser beam irradiation.

Further, the filling layer pattern 185 may be formed using an insulation material such as, silicon nitride and/or silicon oxide.

Then, upper portions of the charge storage structure 160, the channel 170 and the filling layer pattern 185 may be removed by an etch-back process, thereby forming a recess. A pad layer may be formed on the uppermost insulating interlayer 120e, the charge storage structure 160, the channel 170 and the filling layer pattern 185, and an upper portion of the pad layer may be planarized, until a top surface of the uppermost insulating interlayer 120e is exposed, thereby forming the pad 190. For example, the pad 190 may include polysilicon and/or single crystalline silicon which may be undoped and/or doped with n-type impurities such as phosphorous (P), arsenic (As), etc. In some embodiments, a preliminary pad layer may be formed by amorphous silicon, and then the preliminary pad layer may be crystallized to form the pad layer. The planarization process may include a CMP process.

In some embodiments, after forming the channel hole 150 and before forming the charge storage structure 160, a semiconductor pattern (not shown) may be formed to fill a lower portion of the channel hole 150. The semiconductor pattern may be formed by a selective epitaxial growth (SEG) process using the exposed top surface of the substrate 100 as a seed. Therefore, the semiconductor pattern may include single crystalline silicon and/or single crystalline germanium. In some embodiments, an amorphous silicon layer may be formed to fill the lower portion of the channel hole 150, and a laser epitaxial growth (LEG) process or a solid phase epitaxial (SPE) process may be performed on the amorphous silicon layer to form the semiconductor pattern. In this case, the charge storage structure 160 and the channel 175 may be formed on the semiconductor pattern.

Figure 15:
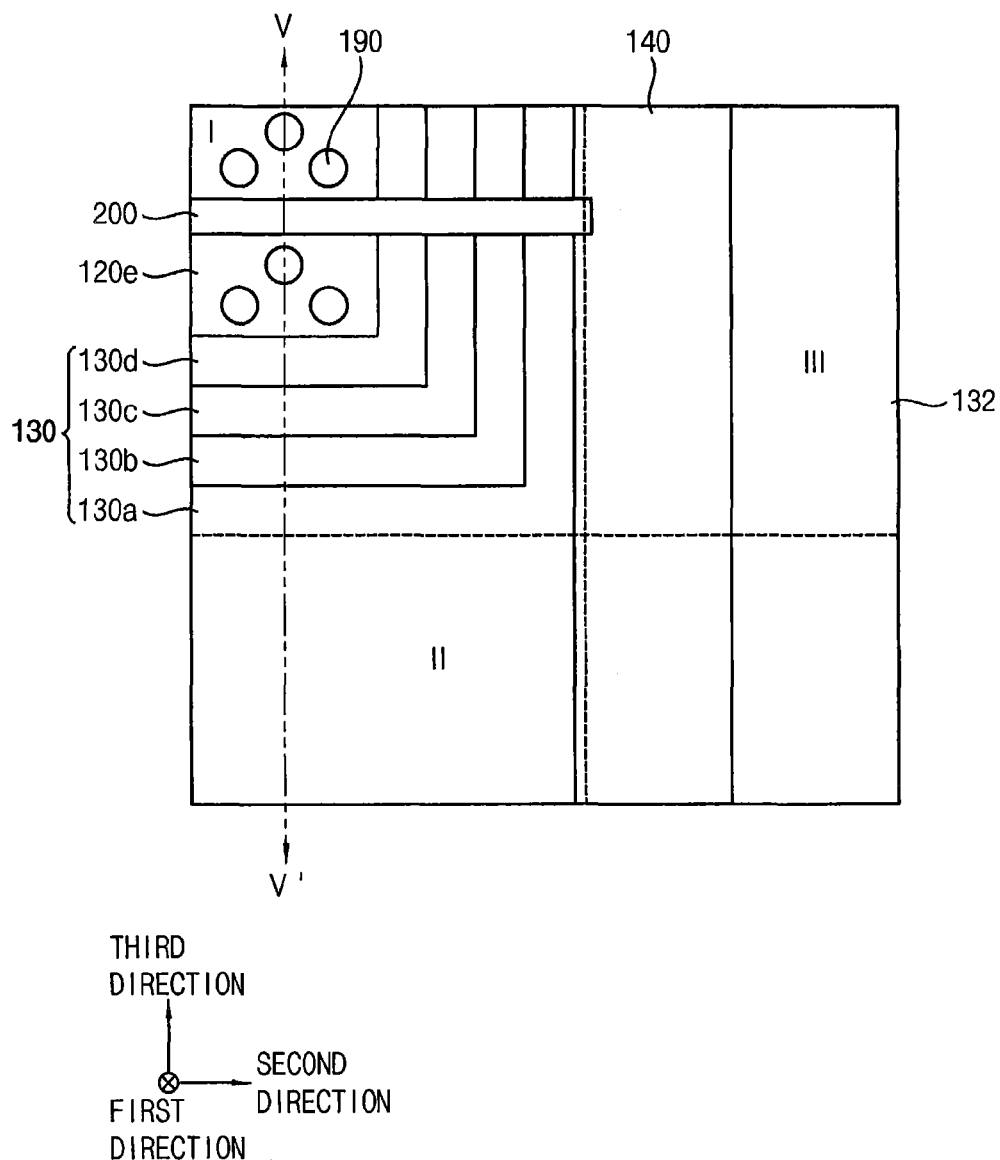
Figure 16:
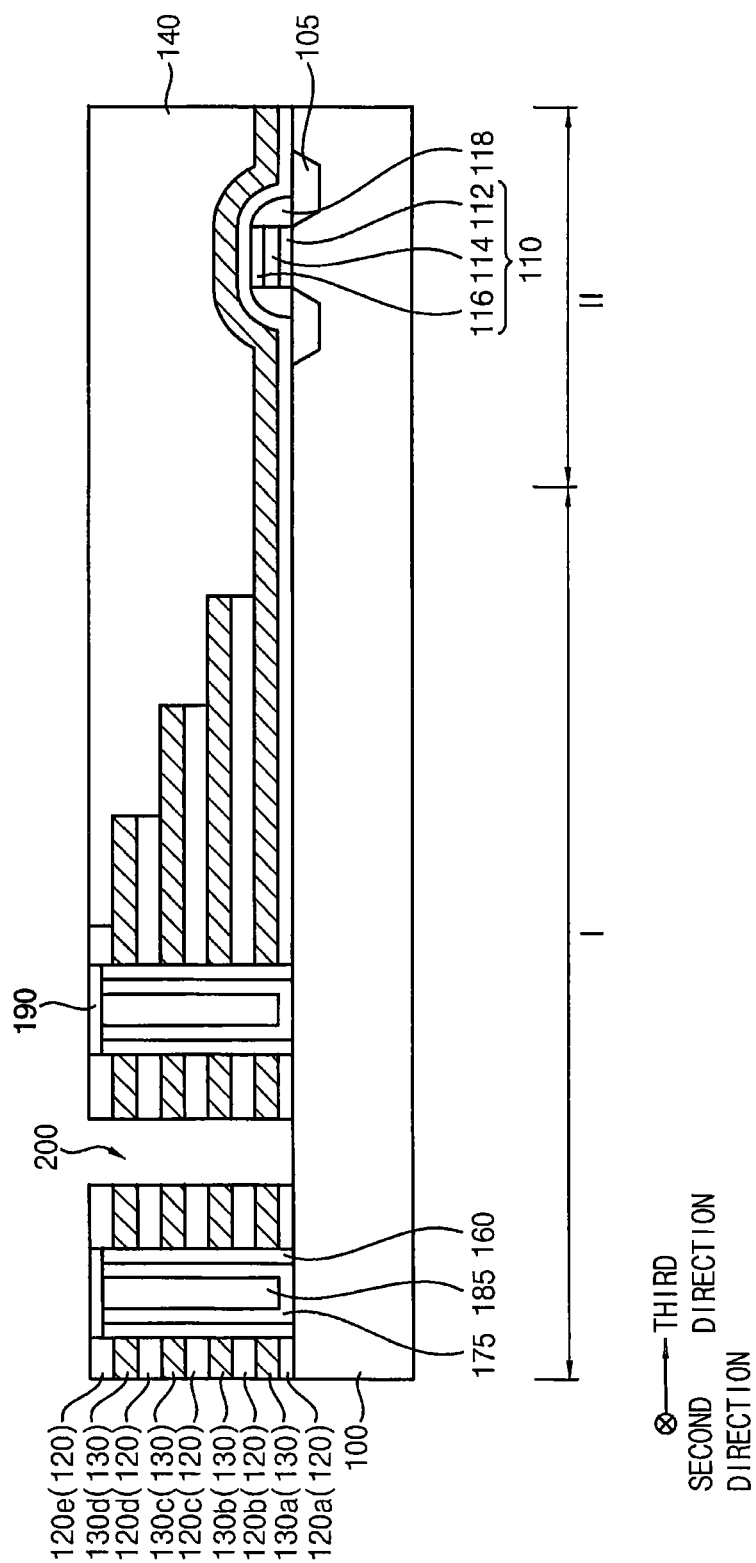

Referring to FIGS. 15 and 16, the insulating interlayers 120 and the sacrificial layers 130 may be partially removed to form an opening 200.

A hard mask (not shown) may be formed on the pads 190, the uppermost insulating interlayer 120e and the mold protection layer 140, and the insulating interlayers 120, the sacrificial layers 130 and the mold protection layer 140 may be removed by a dry etching process using the hard mask as an etching mask. The hard mask may be removed by an ashing process or a strip process, after forming the opening 200.

The opening 200 may extend in the second direction in the first region I of the substrate 100. In some embodiments, a plurality of openings 200 may be arranged in the third direction.

The opening 200 may protrude from the lowermost sacrificial layer 130a in the second direction. That is, a length of the opening 200 in the second direction may be substantially larger than a length of the lowermost sacrificial layer 130a in the second direction. Further, the length of the opening 200 in the second direction may be substantially larger than a length of the GSL 226 (See FIG. 22) that will replace the lowermost sacrificial layer 130a. Therefore, the lowermost sacrificial layers 130a in the first region I may be separated from each other by the openings 200. That is, the opening 200 may separate the insulating interlayers 120 and the sacrificial layers 130 in the second direction, and the insulating interlayers 120 and the sacrificial layers 130 at each level may extend in the second direction. Further, the opening may not overlap the protection layer pattern 132 in the third region III.

Some embodiments provide that a top surface of the substrate 100, a sidewall of the insulating interlayers 120 and sacrificial layers 130 may be exposed by the opening 200.

Figure 18:
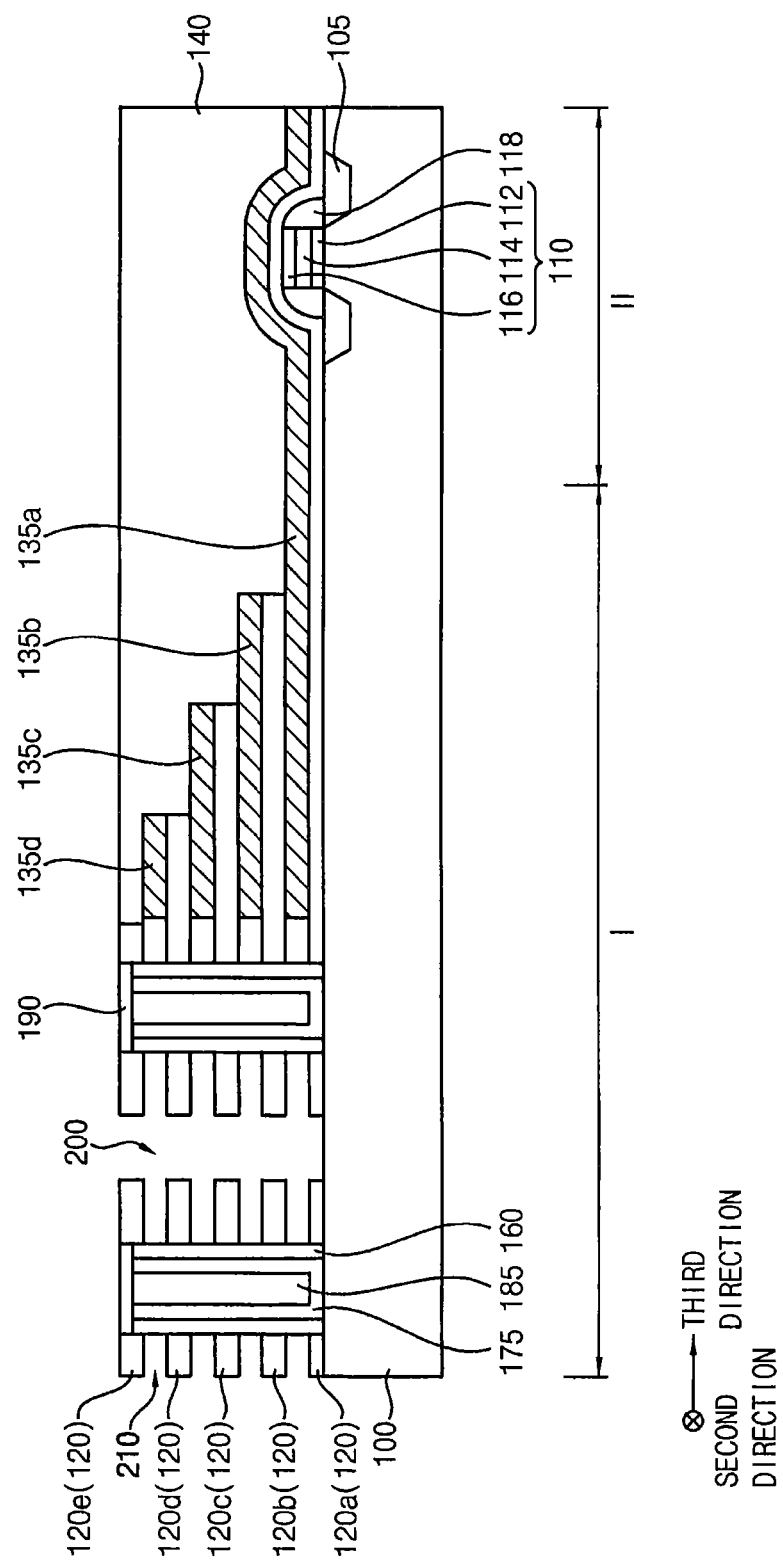
Figure 19:
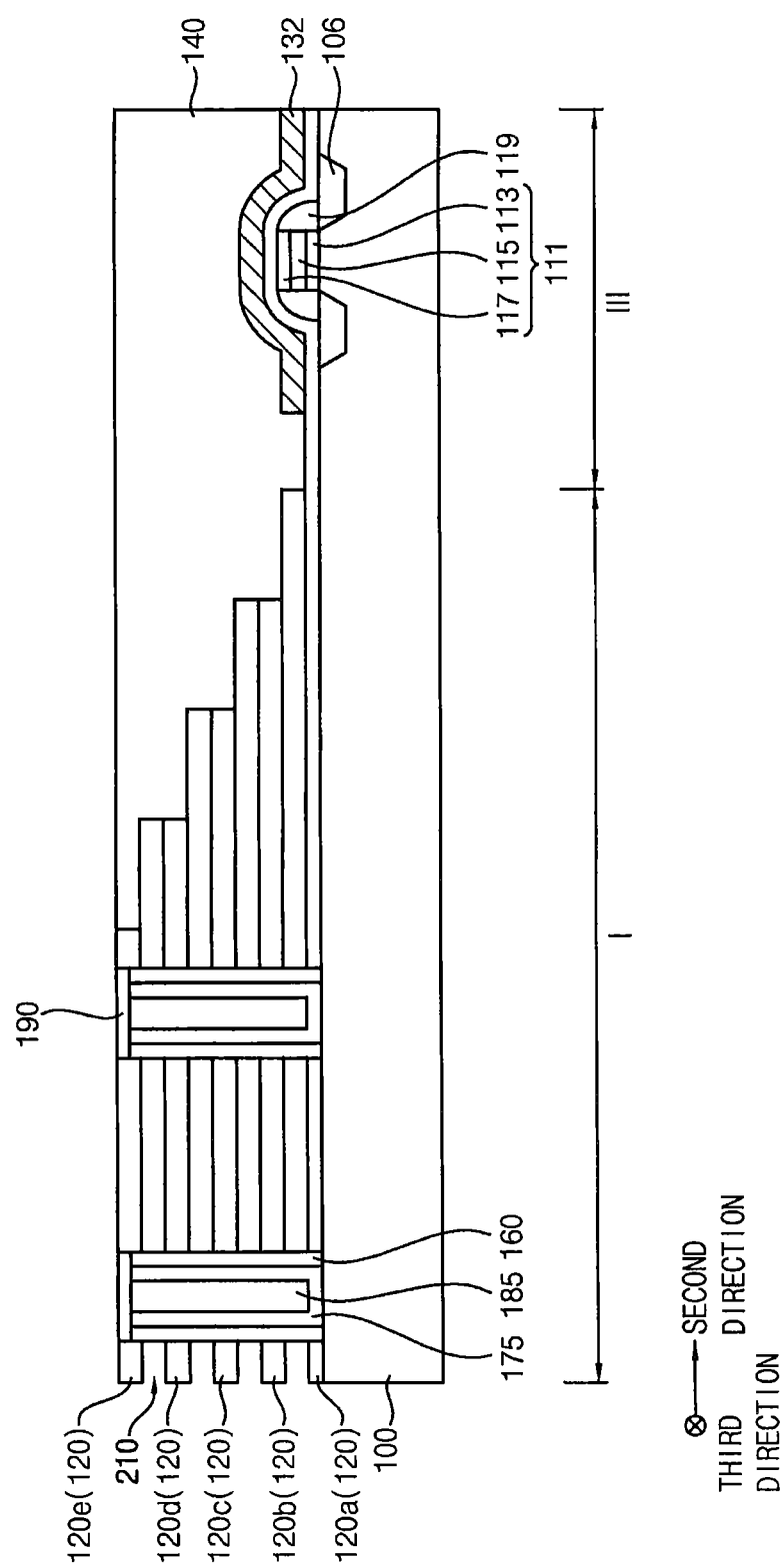

Referring to FIGS. 17 to 19, the sacrificial layers 130 exposed by the opening 200 may be partially removed.

In some embodiments, the sacrificial layers 130 may be removed by a wet etching process using etching solution having a relatively high etch rate with respective to silicon nitride. For example, the etching solution may include phosphate acid and/or sulfuric acid.

During the wet etching process, portions of the sacrificial layers 130 exposed by the opening 200 may be etched firstly. Therefore, by adjusting a period of the wet etching process, the sacrificial layers 130 may be partially removed. For example, some portions of the sacrificial layers 130 in the first region I may be removed, while other portions of the sacrificial layers 130 in the first region I and the third region III may remain. The remaining portions of the sacrificial layers 130 may be defined as remaining sacrificial layer patterns 135a, 135b, 135c and 135d.

The opening 200 may not overlap the protection layer pattern 132, and the lowermost sacrificial layer 130a and the protection layer pattern 132 may be separated by the mold protection layer 140, so that the protection layer pattern 132 may not be removed during the wet etching process.

As the portions of the sacrificial layers 130 are removed, a gap 210 is defined between adjacent insulating interlayers 120, and outer sidewall of the charge storage structure 160 may be exposed by the gap 210.

Figure 20:
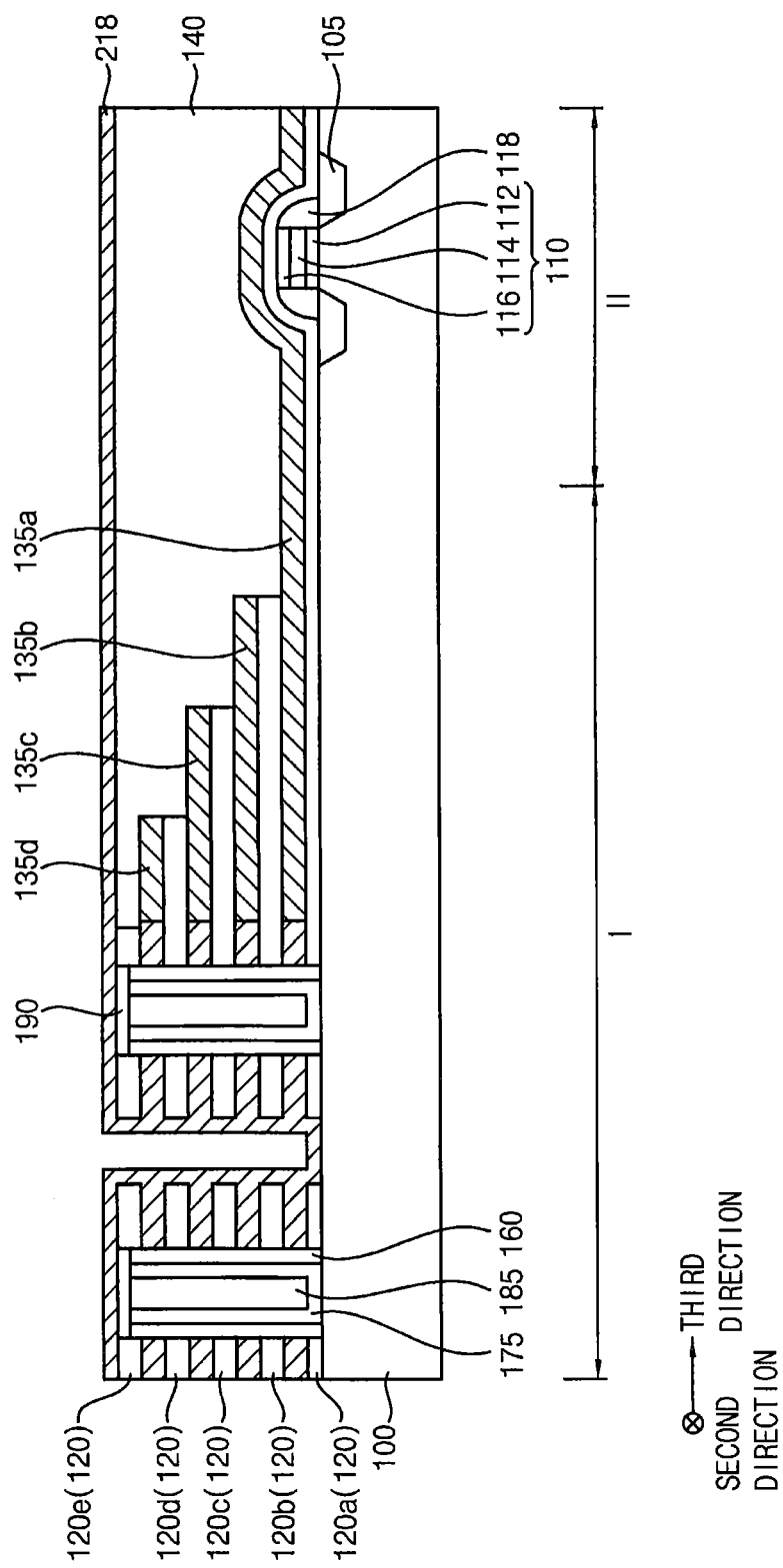

Referring to FIG. 20, a gate electrode layer 218 may be formed the exposed outer sidewall of the charge storage structure 160, surfaces of the insulating interlayers 120, the top surface of the substrate 100 and the top surface of the pad 190.

In some embodiments, the gate electrode layer 218 may sufficiently fill the gaps 210, and may partially fill the opening 200. Further, the gate electrode layer 218 may cover the top surface of the mold protection layer 140.

The gate electrode layer 218 may be formed using a metal and/or a metal nitride. For example, the gate electrode layer 218 may be formed using a metal and/or a metal nitride with low electrical resistance (e.g., tungsten, tungsten nitride, titanium, titanium nitride, tantalum, tantalum nitride and/or platinum.). In some embodiments, the gate electrode layer 218 may have a multi-layered structure including a metal layer and a barrier layer including a metal nitride. The gate electrode layer 218 may be formed by a CVD process, a PECVD process, an ALD process, a PVD process and/or a sputtering process.

In some embodiments, an additional blocking layer (not shown) may be formed on an inner wall of the gaps 210 and the surfaces of the insulating interlayers 120. For example, the additional blocking layer may be formed a metal oxide, e.g., aluminum oxide, hafnium oxide, etc.

Figure 21:
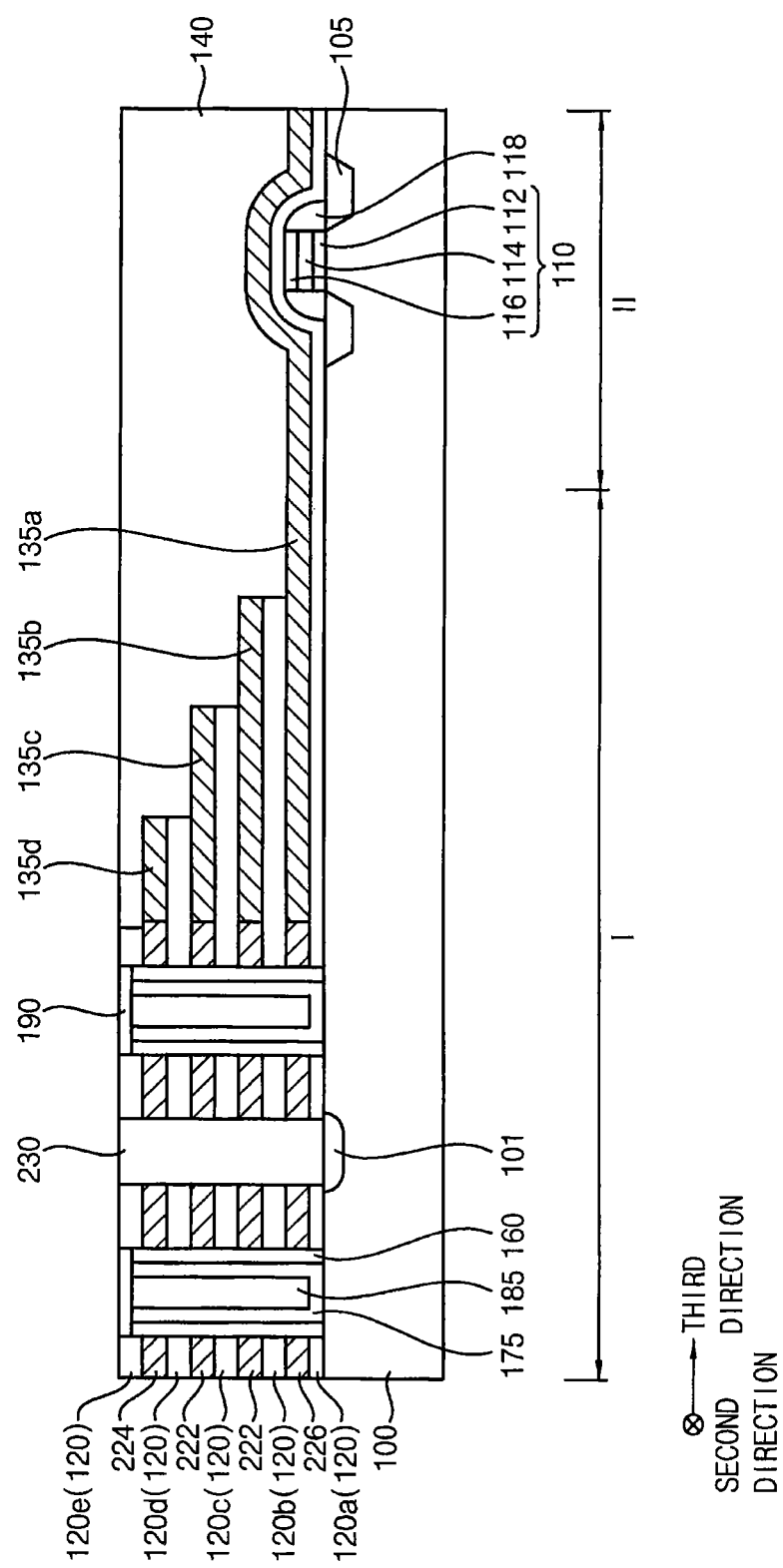
Figure 22:
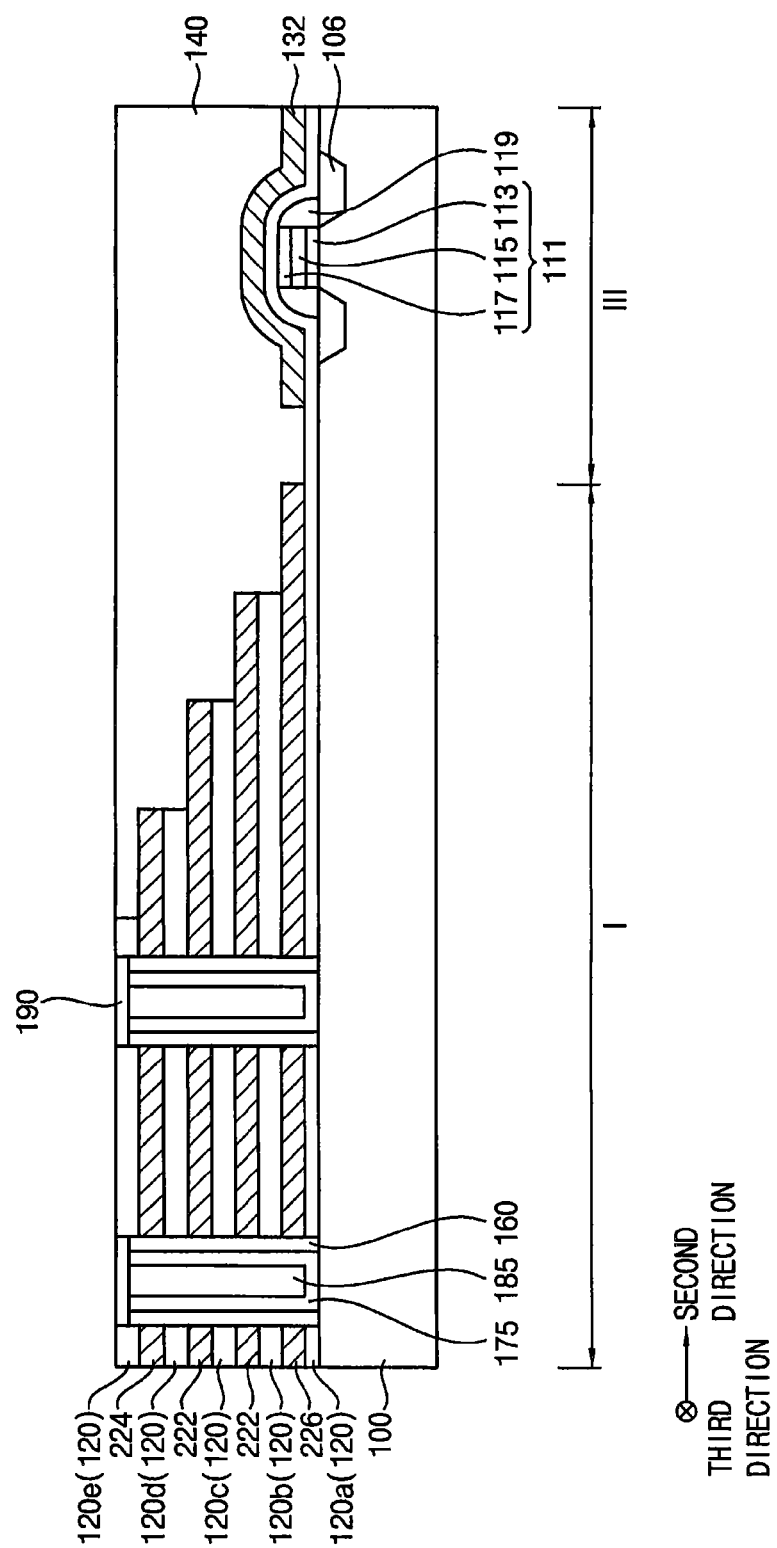

Referring to FIGS. 21 and 22, the gate electrode layer 218 may be partially removed to form a plurality of gate electrodes 220 filling the gaps 210.

In some embodiments, an upper portion of the gate electrode layer 218 may be planarized by a CMP process, until the top surface of the uppermost insulating interlayer 120e is exposed. Then, portions of the gate electrode layer 218 in an inner wall of the opening 200 and the top surface of the substrate 100 may be removed to form the gate electrodes 220. The gate electrode layer 218 may be removed by a wet etching process using an etching solution including hydrogen peroxide (H2O2).

Accordingly, the sacrificial layers 130 at each level may be replaced by the gate electrodes 220. The sacrificial layers 130 may be separated from each other in the third direction, so that the gate electrodes 220 may be separated from each other in the third direction.

The gate electrodes 220 may include a word line 222, a string selection line (SSL) 224 and a ground selection line (GSL) 226. For example, the lowermost gate electrode 220 may be defined as the GSL 226, and the uppermost gate electrodes 220 may be defined as the SSL 224. Further, the gate electrodes 220 between the GSL 226 and the SSL 224 may be defined as the word lines 222.

The gate electrodes 220 at each level may extend to surround the charge storage structure 160 and the channel 175. Further, the gate electrodes 220 at each level may surround the plurality of channels 175 of the plurality of channel rows.

Then, a third impurity region 101 may be formed at an upper portion of the substrate 100 exposed by the opening 200, and an insulation layer pattern 230 may fill the opening 200.

In some embodiments, an ion implantation mask may be formed to cover the pad 190, and n-type impurities, such as phosphorous (P), arsenic (As), etc. may be implanted into the substrate 100, thereby forming the third impurity region 101. The first impurity region 105 may extend in the second direction, and may serve as a common source line (CSL). In some embodiments, a metal silicide pattern (not shown)

such as cobalt silicide pattern or nickel silicide pattern may be formed on the third impurity region 101, so that the metal silicide pattern may reduce the electrical resistance of the CSL.

Then, an insulation layer may be formed on the third impurity region 101, the insulating interlayers 120, the pads 190 and the mold protection layer 140 to fill the opening 200, and an upper portion of the insulation layer may be planarized by an etch-back process and/or a CMP process, until the uppermost insulating interlayer 120*e* is exposed, thereby forming the insulation layer pattern 230. For example, the insulation layer patterns 230 may include silicon oxide.

Figure 24:
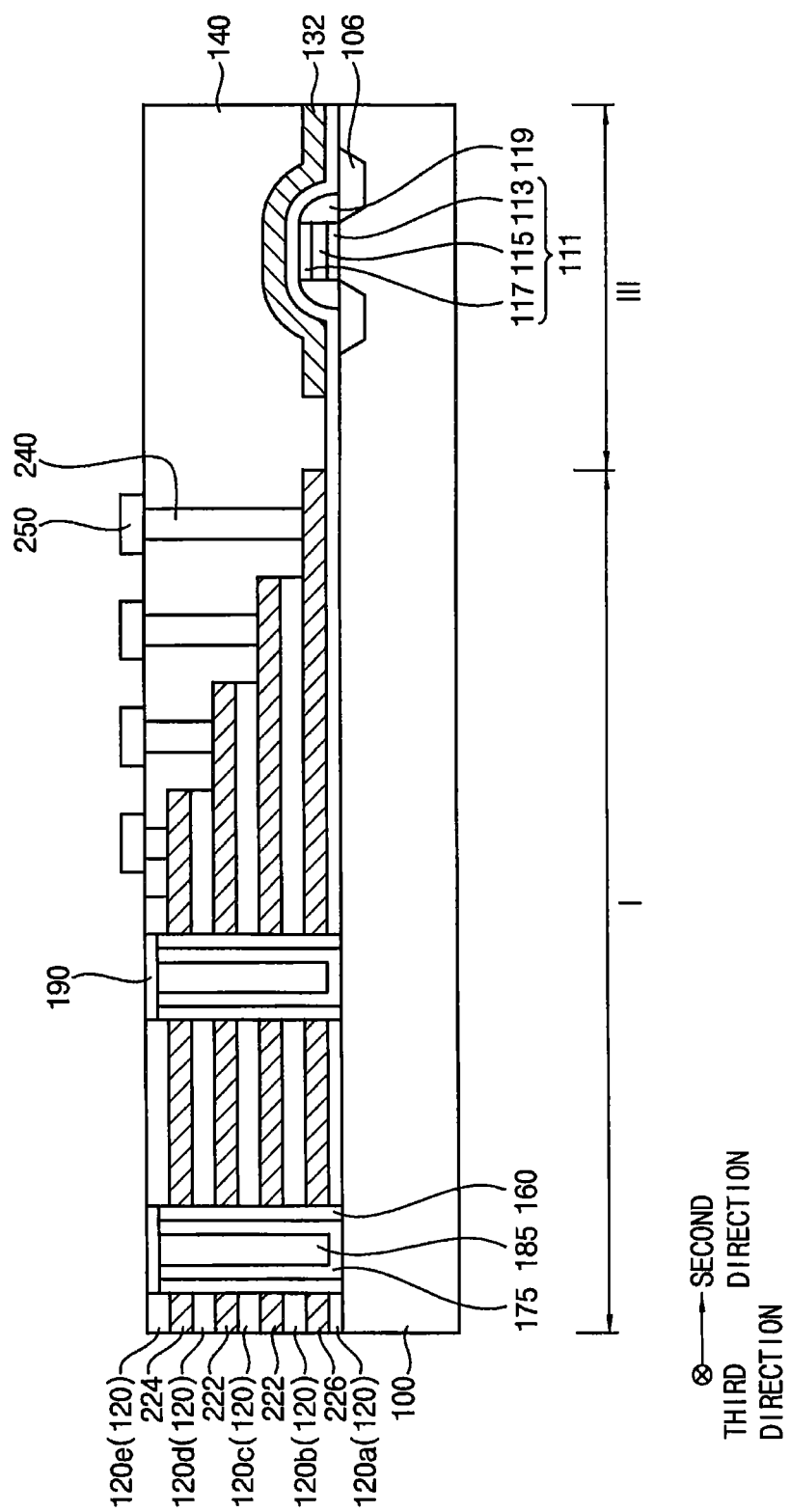

Referring to FIGS. 23 and 24, a first contact 240 may be formed through the mold protection layer 140, and then a first wiring 250 may be formed on the first contact 240.

Particularly, the mold protection layer 140 may be partially removed to form a plurality of contact holes exposing the gate electrodes 220 at each level, respectively. The first contact 240 may be formed to fill the contact holes. Then, the first wiring 250 may be formed on the first contact 240 and the mold protection layer 140, so that the first wiring 250 may be electrically connected to the gate electrodes 220 through the first contact 240. For example, the first wirings 250 may transfer an electrical signal from a decoding circuit in the third region III, and may select a specific word line 222.

Figure 25:
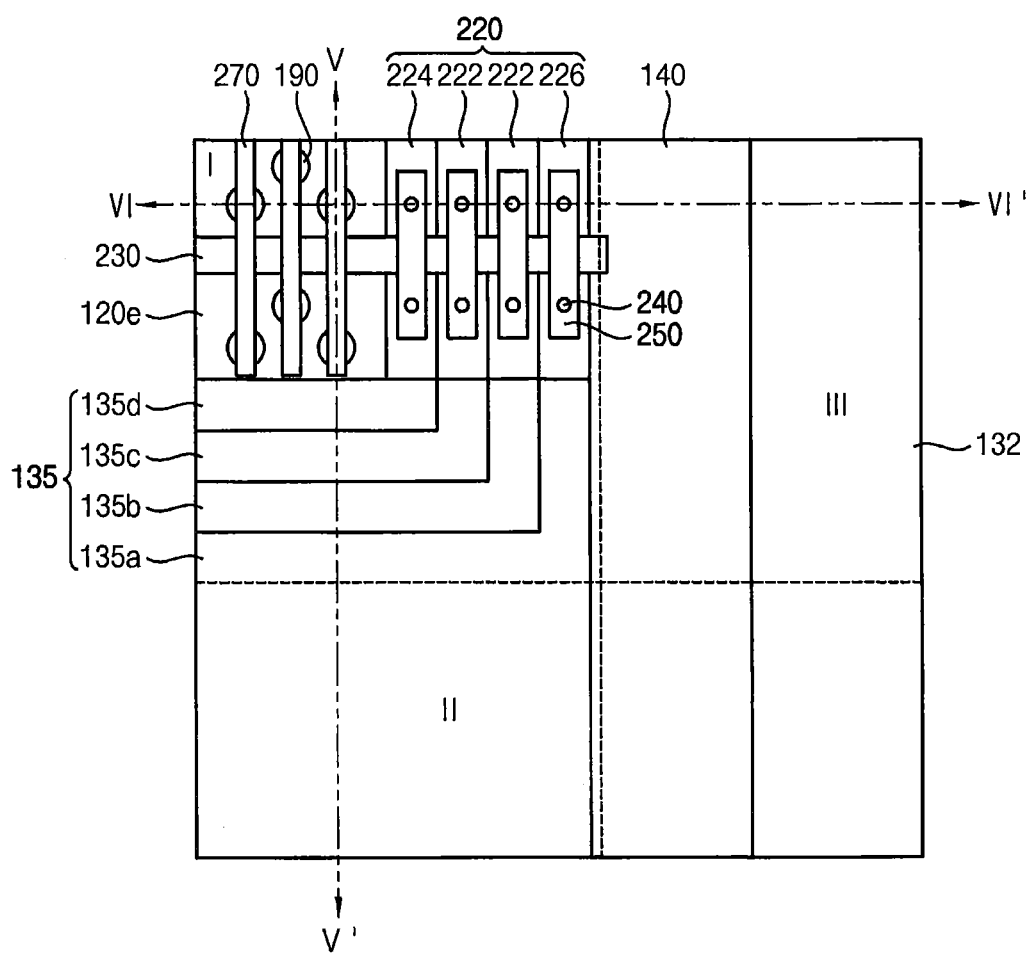
Figure 26:
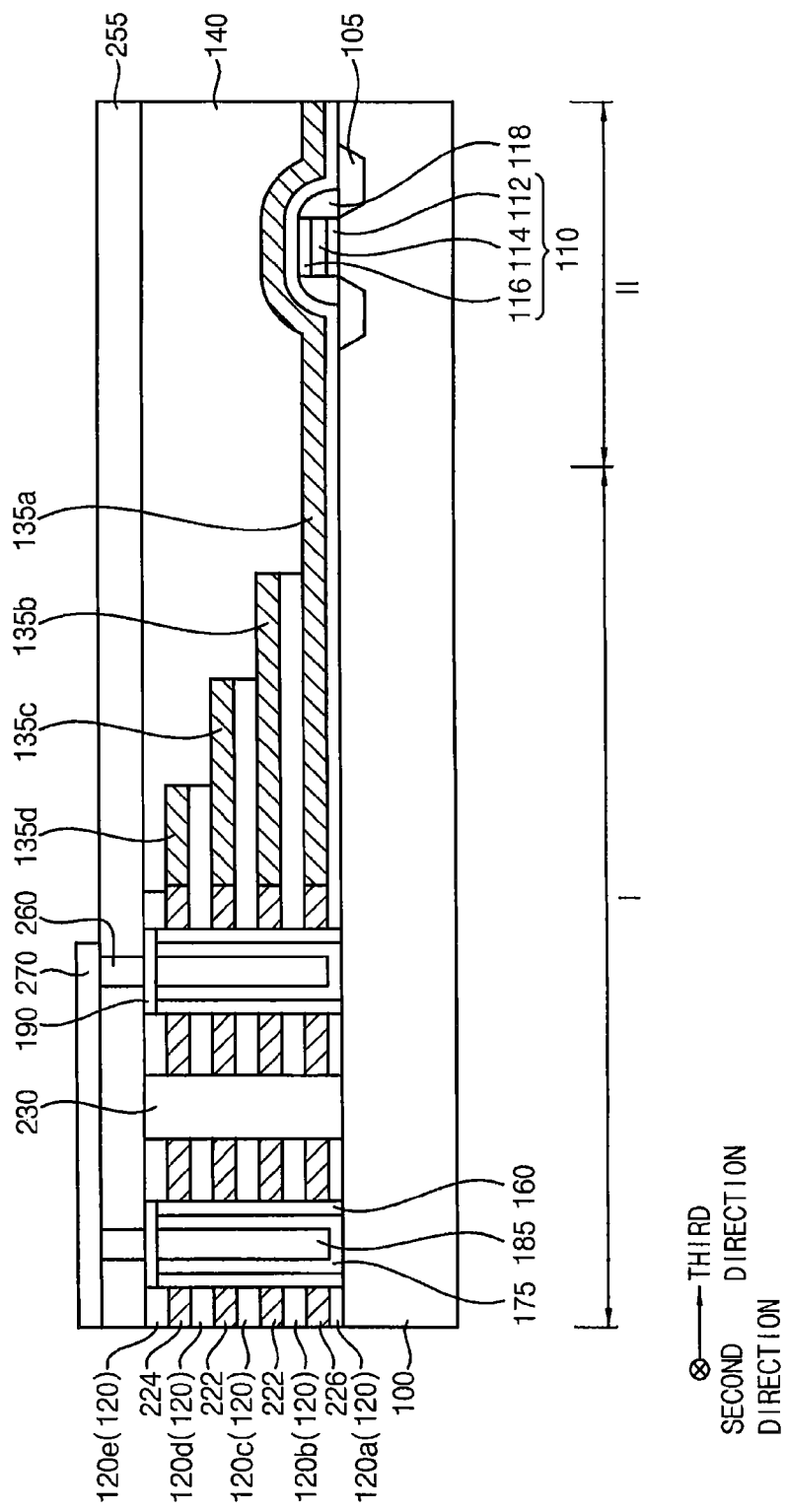
Figure 27:
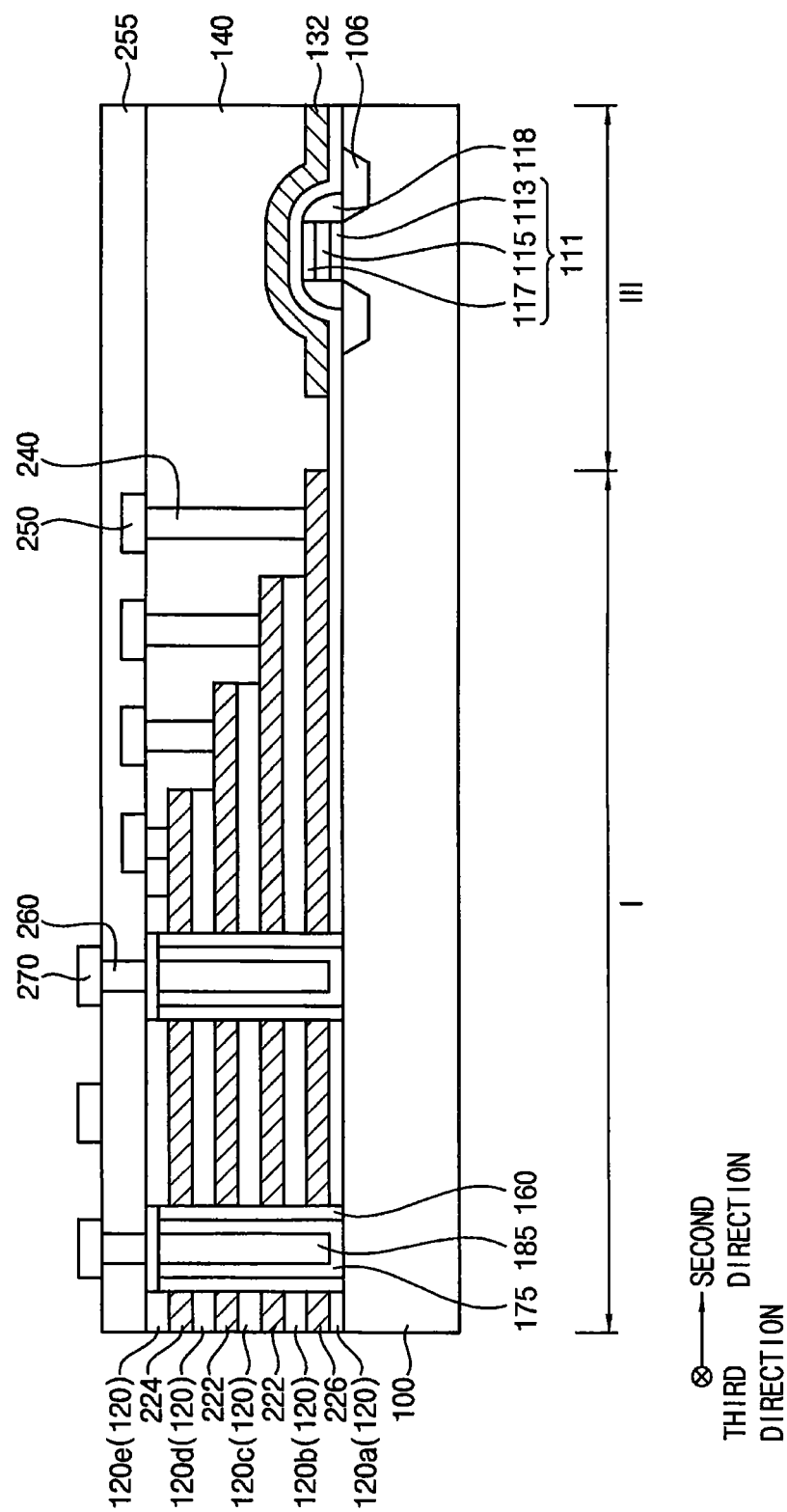

Referring to FIGS. 25 to 27, an upper insulation layer 255 may be formed to cover the first wirings 250, and then a second contact 260 may be formed through the upper insulation layer 255. Further, a second wiring 270 may be formed on the second contacts 260.

Particularly, the upper insulation layer 255 may be partially removed to form a plurality of contact holes exposing the pads 190, respectively. The second contact 260 may be formed to fill the contact holes. Then, the second wiring 270 may be formed on the second contact 260 and the upper insulation layer 255, so that the second wiring 270 may be electrically connected to the channel 175 through the second contact 260 and the pads 190.

In some embodiments, the second contacts 260 may serve as a bit line contact, and the second wirings 270 may serve as a bit line. In some embodiments, a plurality of second wirings 270 may be arranged in the second direction, and each of the second wirings 270 may extend in the third direction. For example, the second wirings 270 may serve as a bit line.

Figure 28:
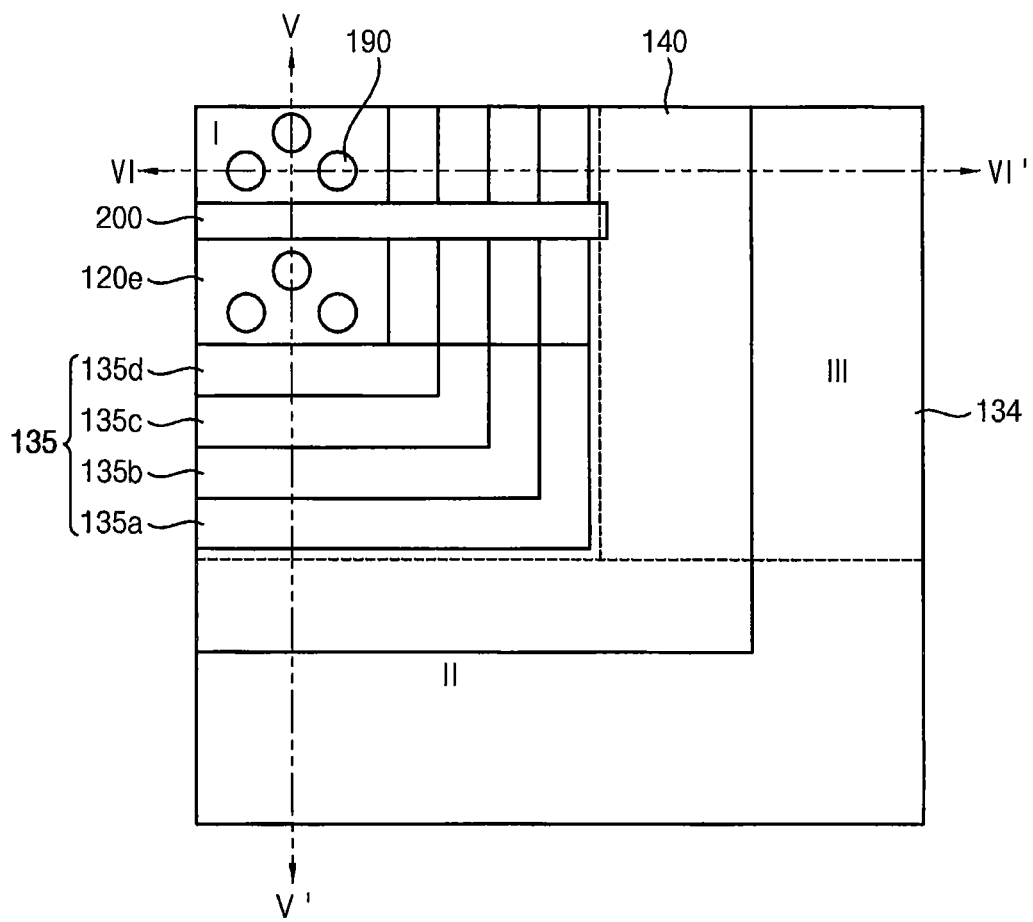
Figure 29:
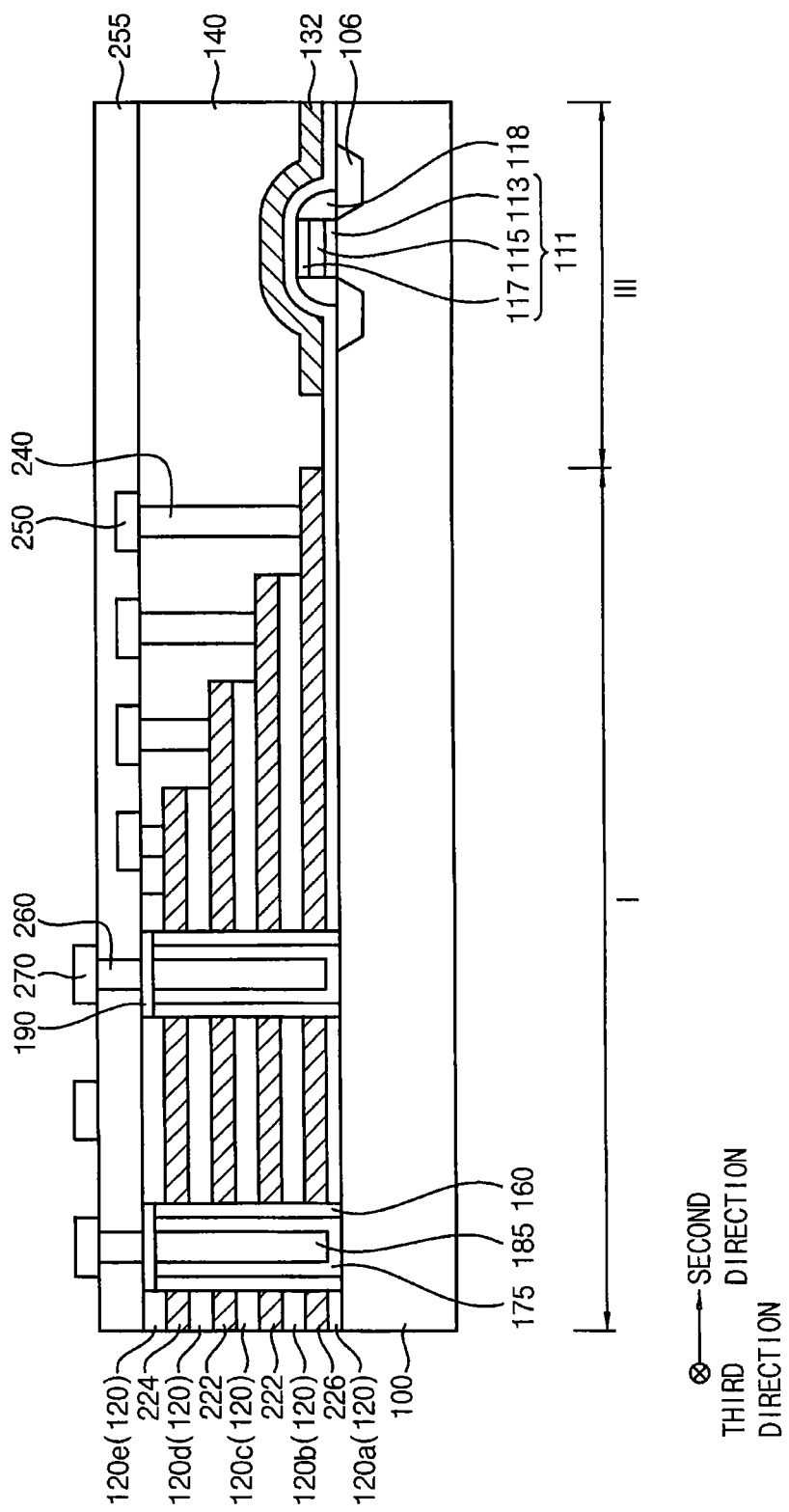
Figure 30:
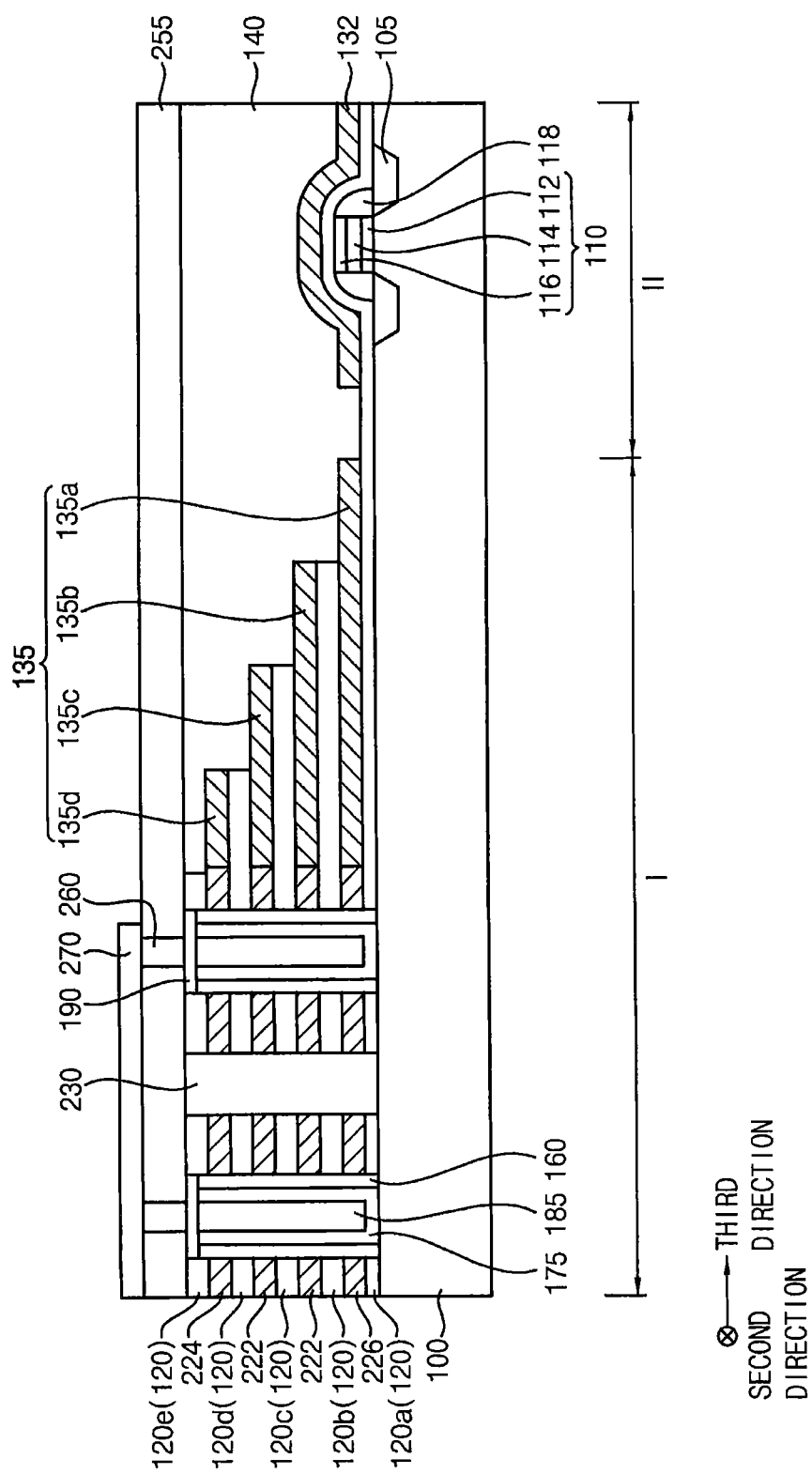

FIG. 28 is a plan view illustrating a vertical memory device in accordance with some embodiments, FIG. 29 is a cross-sectional views cut along line VI-VI' of FIG. 28, and FIG. 30 is a cross-sectional views cut along line V-V' of FIG. 28. For the convenience of description, some elements, e.g., gate electrodes 220, first wirings 240 and the second wirings 270 may be omitted in FIG. 28.

The vertical memory device illustrated in FIGS. 28 to 30 may be substantially identical to or substantially similar to those described with reference to FIGS. 2 to 4, except for remaining sacrificial layer patterns 135 and the protection layer pattern 132. Therefore, detailed redundant descriptions thereof will be omitted. Like or similar reference numerals may refer to like or similar elements throughout.

The vertical memory device may include a plurality of vertical channel structures which may extend from a substrate 100 in the first direction. The vertical channel structures may include a channel 175, a charge storage structure 160 stacked on an outer sidewall of the channel 175 and a filling layer pattern 185 disposed inside the channel 175. The vertical memory device may further include a plurality of gate electrodes 220 which may be disposed on an outer sidewall of the charge storage structure 160, and may be spaced apart from each other in the first direction. The vertical memory device may further include a pad 190 which may be disposed on and may contacts the channel 175 and the charge storage structure 160.

Referring to FIGS. 28 to 30, the gate electrodes 220, the remaining sacrificial layer patterns 135 and the insulating interlayers 120 may constitute a pyramid shaped stack structure.

A length of each remaining sacrificial layer pattern 135 in the third direction may gradually decrease, as a level of each remaining sacrificial layer pattern 135 gets higher. Therefore, a plurality of remaining sacrificial layer patterns 135 may be stacked to have a pyramid shape or a step shape in the first direction. In some embodiments, a lowermost remaining sacrificial layer pattern 135*a* may cover the first region I, and may not cover the second region II and the third region III.

In some embodiments, a protection layer pattern 134 may be disposed in the second region II and the third region III of the substrate 100. That is, the protection layer pattern 134 may protect peripheral circuits in the second region II and the third region III.

The protection layer pattern 134 may be formed during the deposition process and the etching process for forming the lowermost remaining sacrificial layer pattern 135*a*. The protection layer pattern 134 and the lowermost remaining sacrificial layer pattern 135*a* may be disposed at the same level, however the protection layer pattern 134 and the lowermost remaining sacrificial layer pattern 135*a* may be spaced apart from each other in the second direction and the third direction, and the mold protection layer 140 may be disposed therebetween. Accordingly, the mold protection layer 140 may cover protection layer pattern 134, and the protection layer pattern 134 may not be removed or damaged, during a process for forming the GSL 226.

FIGS. 31 to 37 are plan views and cross-sectional views illustrating methods of manufacturing a vertical memory device in accordance with some embodiments. The figures show methods of manufacturing the vertical memory device of FIGS. 28 to 30, however, may not be limited thereto.

Figure 31:
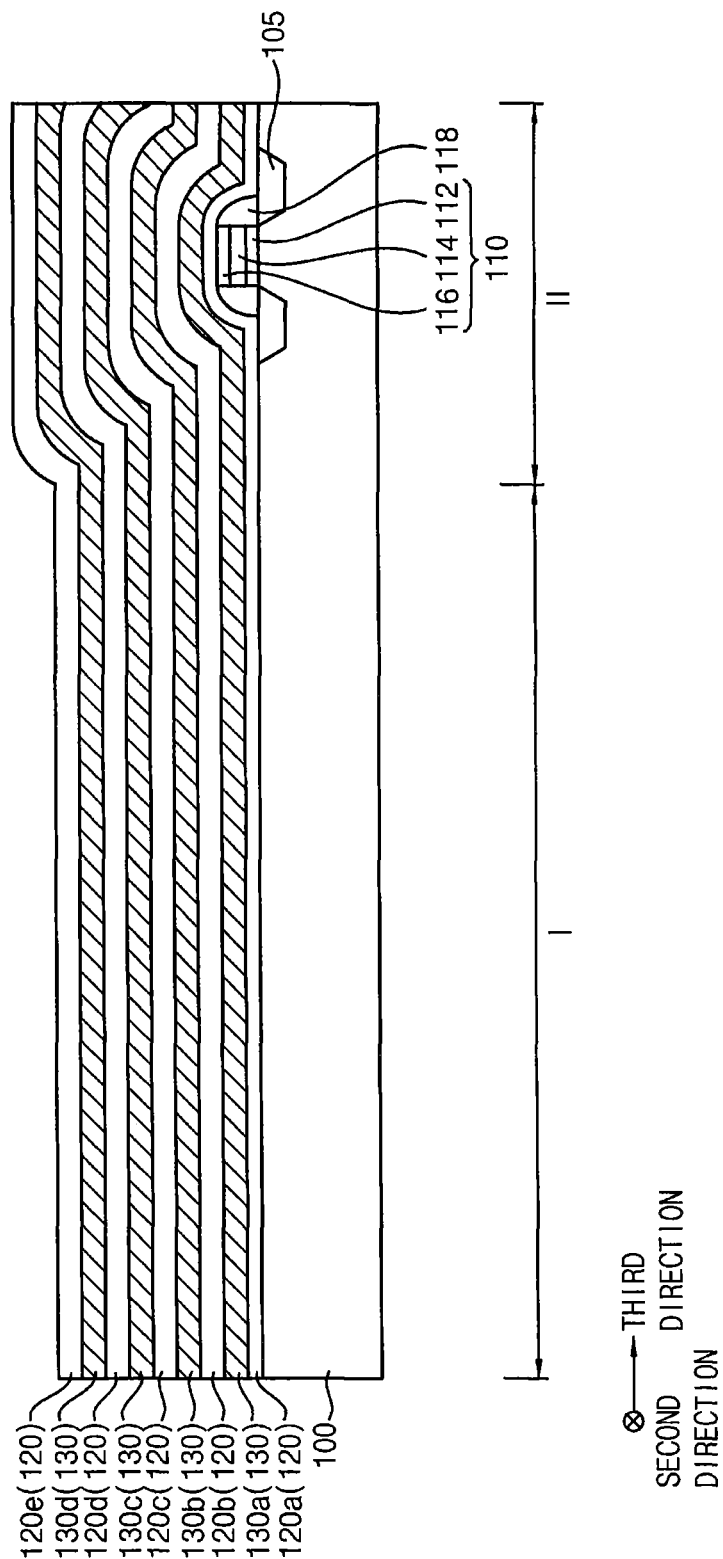
Figure 32:
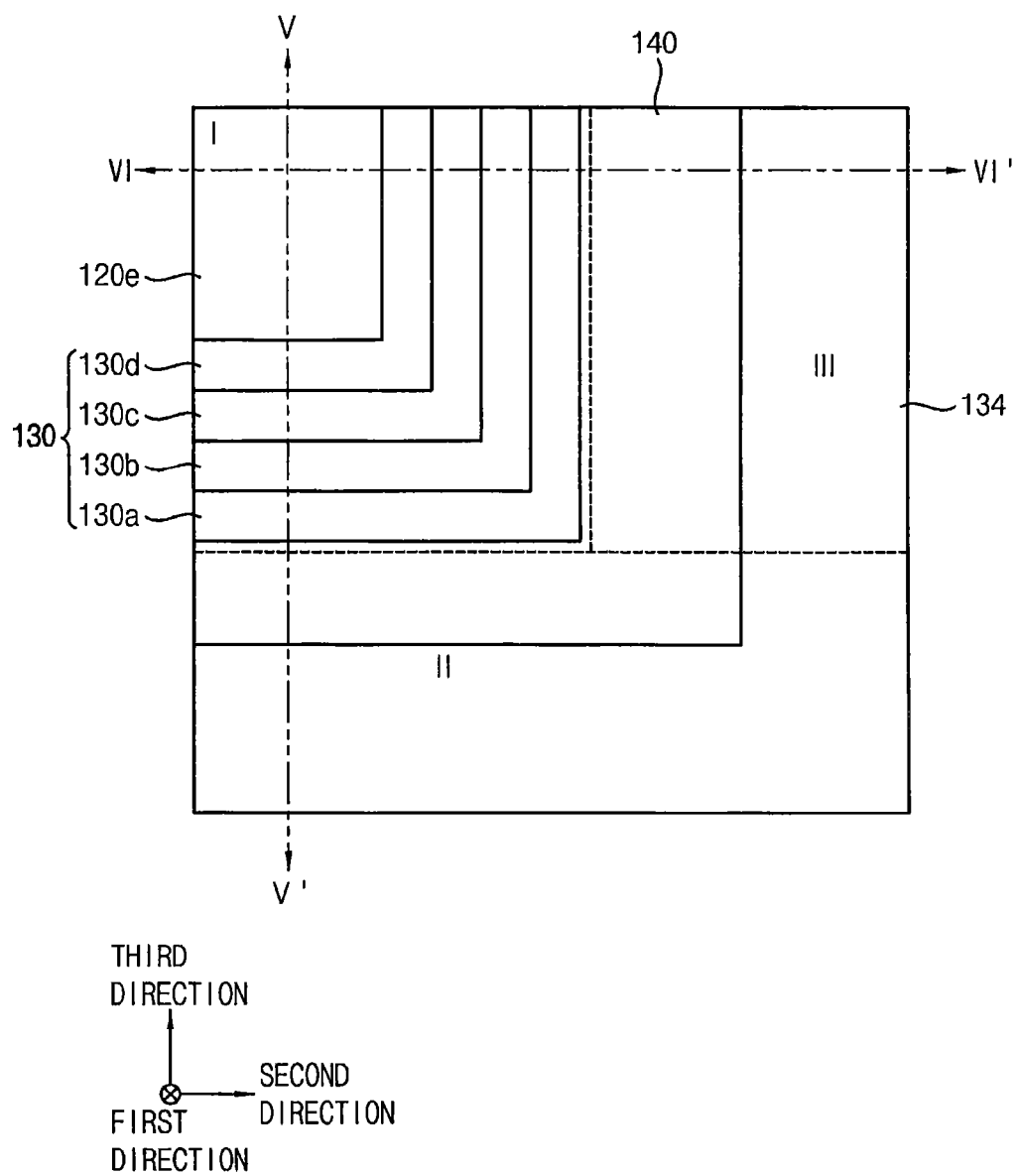

Particularly, FIGS. 32, 34 and 36 are plan views illustrating methods of manufacturing the vertical memory device, FIGS. 31, 33, 35 and 37 are cross-sectional views cut along the line V-V' of the plan views. Like or similar reference numerals may refer to like or similar elements throughout.

Referring to FIG. 31, processes substantially the same as or similar to those illustrated with reference to FIGS. 5 and 6 may be performed. That is, a first gate structure 100 and a first impurity region 105 may be formed in the second region II of the substrate 100, and a plurality of insulating interlayers 120 and a plurality of sacrificial layers 130 may be alternately and repeatedly stacked to form a mold structure.

Figure 33:
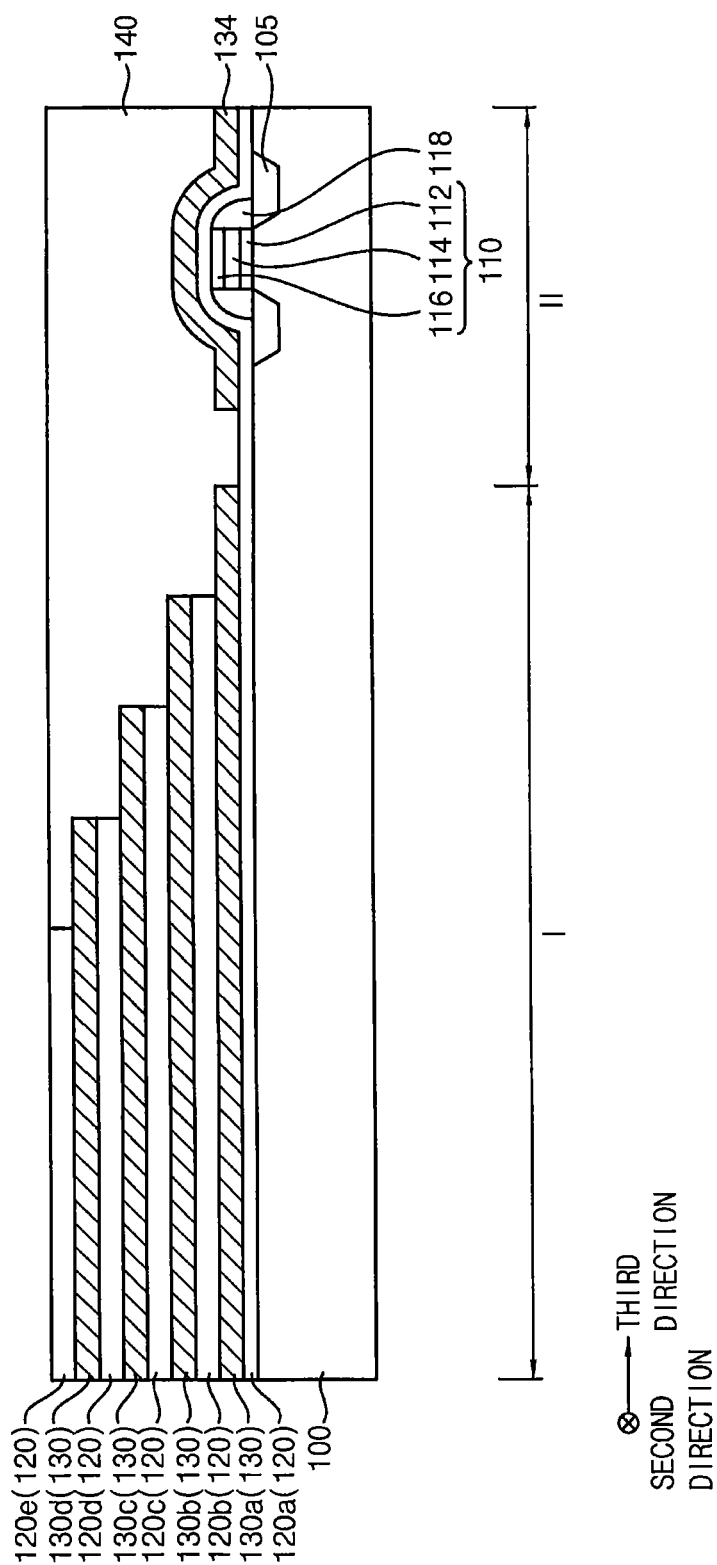

Referring to FIGS. 32 and 33, the insulating interlayers 120 and the sacrificial layers 130 may be partially removed to form a pyramid shaped stack structure. The processes may be substantially identical to or similar to those described with reference to FIGS. 7 to 9.

In some embodiments, the insulating interlayers 120 except for a lowermost insulating interlayer 120*a* and the sacrificial layers 130 except for a lowermost sacrificial layer 130*a* may be removed in the second region II and the third region III of the substrate 100.

However, the lowermost insulating interlayer 120a and the lowermost sacrificial layer 130a may remain in the second region II or the third region III. In some embodiments, the lowermost sacrificial layer 130a may be partially removed, so that the lowermost sacrificial layer 130a may be disposed in the first region I, and a protection layer pattern 134 may be spaced apart from the lowermost sacrificial layer 130a in the second direction and the third direction. Therefore, the protection layer pattern 134 may be disposed in the second region II and the third region III to cover the first gate structure 110 in the second region II and a second gate structure 111 in the third region.

In some embodiments, the protection layer pattern 134 may be formed simultaneously during deposition processes and etching processes for forming the lowermost sacrificial layer 130a. Therefore, the methods of manufacturing the vertical memory device may be simplified.

Figure 35:
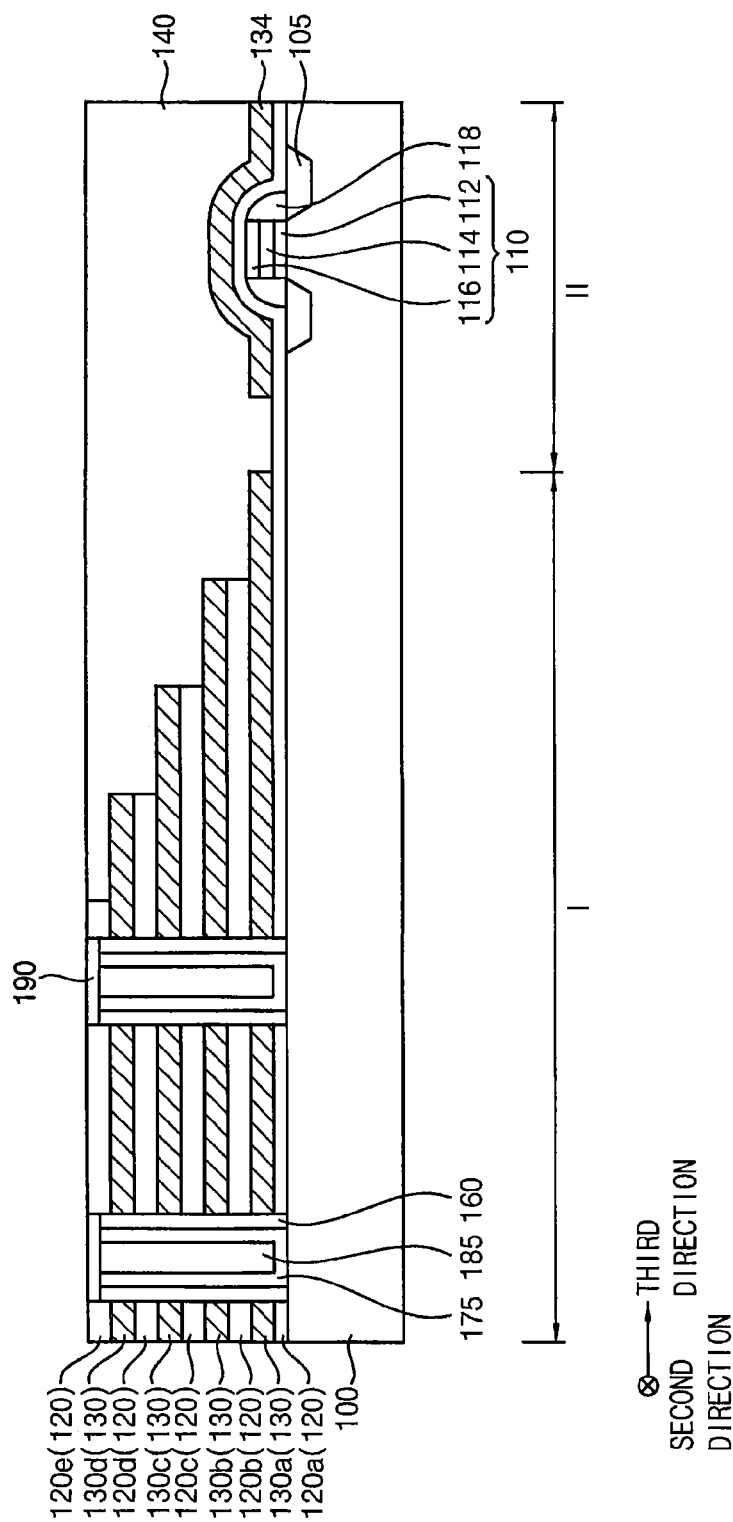

Referring to FIGS. 34 and 35, a plurality of channel holes 150 may be formed through the insulating interlayers 120 and the sacrificial layers 130, and a plurality of charge storage structures 160, a plurality of channels 175, a plurality of filling layer patterns 185 and a plurality of pads 190 may be formed to fill the plurality of channel holes 150, respectively. The processes may be substantially identical to or substantially similar to those described with reference to FIGS. 10 to 14.

Figure 37:
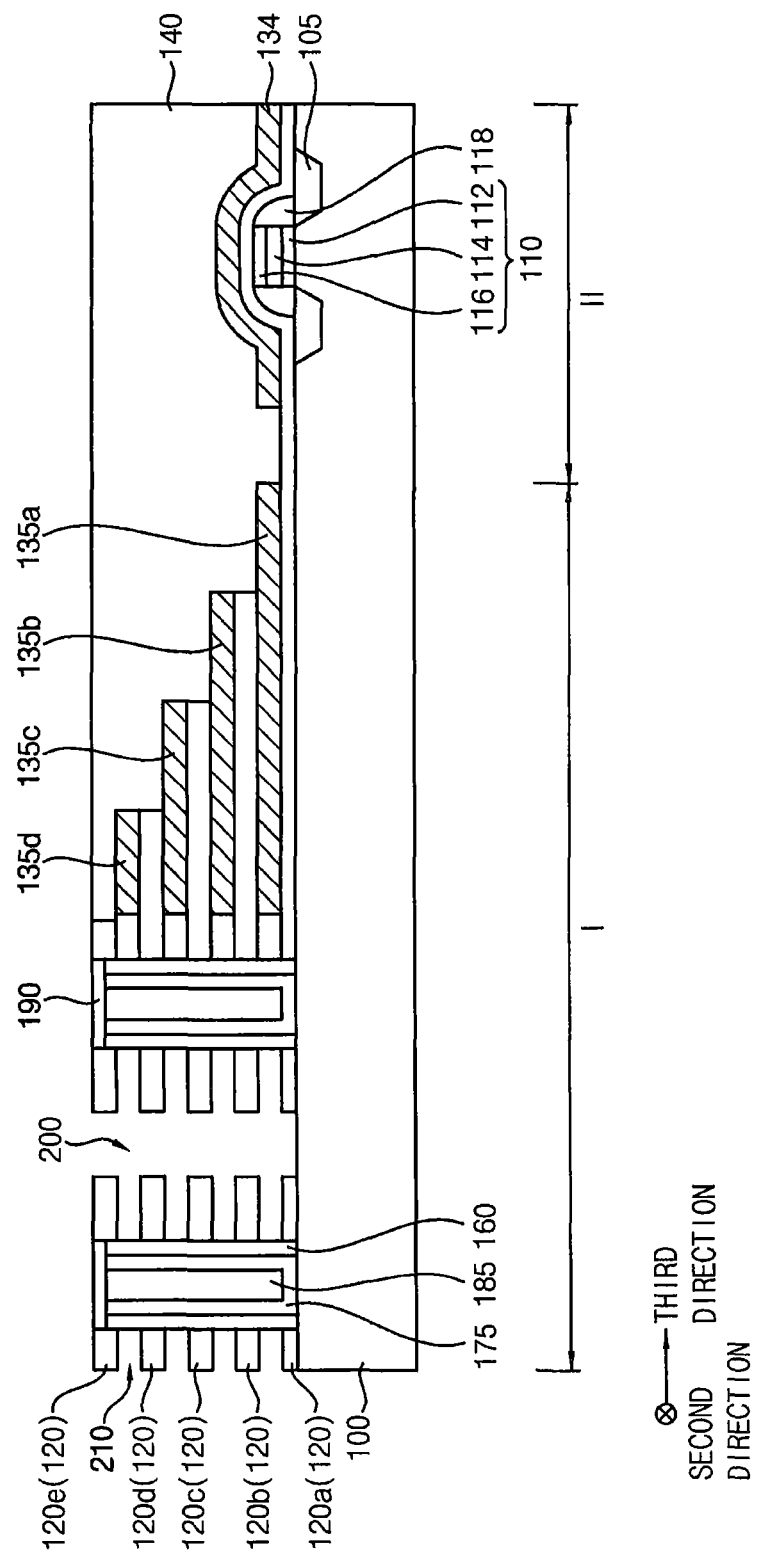

Referring to FIGS. 36 and 37, the insulating interlayers 120 and the sacrificial layers 130 may be partially removed to form an opening 200, and then the sacrificial layers 130 exposed by the opening 200 may be partially removed.

The sacrificial layers 130 may be removed by a wet etching process using etching solution having a relatively high etch rate with respective to silicon nitride.

In some embodiments, by adjusting a period of the wet etching process, the sacrificial layers 130 may be partially removed as illustrated in FIGS. 36 and 37.

In some embodiments, the wet etching process may be sufficiently performed to remove the sacrificial layers entirely. However, the protection layer pattern 134 may be spaced apart from the lowermost sacrificial layer 130a, and may be covered by a mold protection layer 140, so that the protection layer pattern 134 may not be removed by the wet etch process. That is, the protection layer pattern 134 may protect peripheral circuits in the second region II and the third region III.

Then, processes substantially the same as or similar to those illustrated with reference to FIGS. 20 to 27 may be performed to manufacture the vertical memory device.

Figure 38:
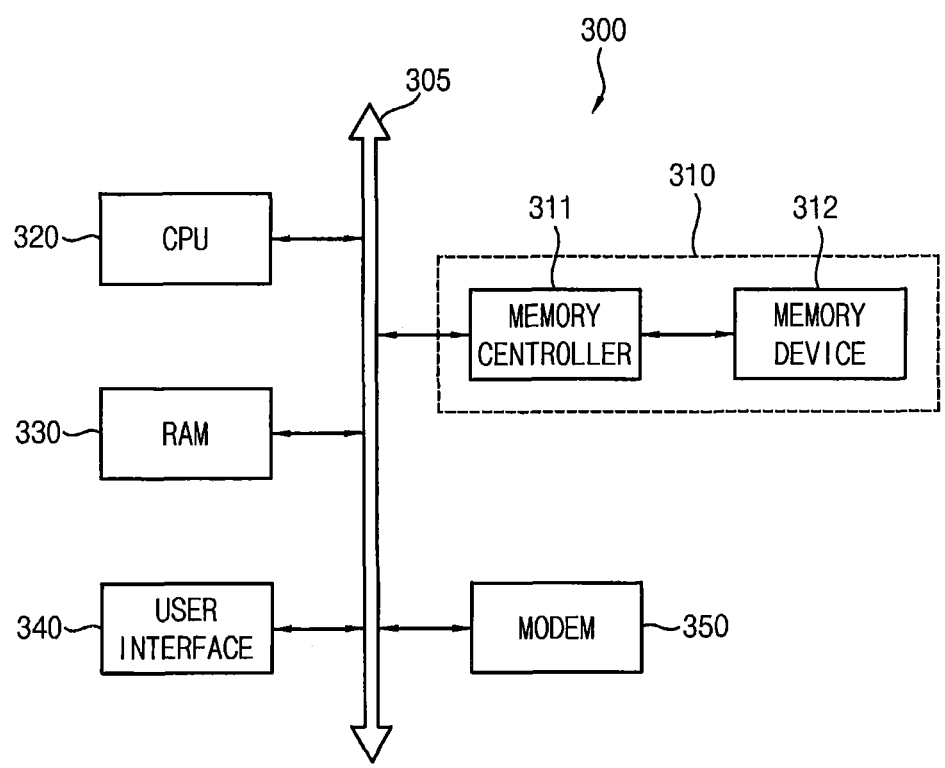

FIG. 38 is a schematic diagram illustrating an electronic system in accordance with some embodiments. Referring to FIG. 38, a memory system 310 may include a memory controller 311 and memory device 312. The memory controller 311 may control data exchange between a host and the memory device 312, and the memory device 312 may correspond to those shown in FIGS. 1 to 4. The memory system 310 may be applied to an information processing system such as a mobile device or a desktop computer. The information processing system 300 may include the memory system 310, a modem 350, CPU 320, RAM 330, and a user interface 340, which are connected with a system bus 305. Data processed by the CPU 320 or received from an external device may be stored in the memory system 310. In the event that the memory system 310 is formed of the SSD, the information processing system 300 may store mass data in the memory system 310 safely. With an increase in the reliability, the memory system 310 may reduce resources needed for error correction such that a high-speed data exchange function is provided to the information processing system 300. Although not shown in the figures, it should be understood that the information processing system 300 may further include an application chipset, camera image processor (CIS), input/output device, and the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
   a substrate including a first region and a second region;
   a plurality of channels in the first region, the plurality of channels extending in a first direction that is substantially perpendicular to a top surface of the substrate;
   a charge storage structure on a sidewall of ones of the plurality of channels;
   a plurality of gate electrodes arranged on a sidewall of the charge storage structure and spaced apart from each other in the first direction;
   a first semiconductor structure in the second region; and
   a protection layer pattern covering the first semiconductor structure, the protection layer pattern having a thickness that is substantially similar to a thickness of a lowermost one of the gate electrodes.

2. The vertical memory device of claim 1, wherein the gate electrodes extend in a second direction that is substantially parallel to the top surface of the substrate, the lowermost gate electrode and the protection layer pattern are spaced apart from each other in the second direction, and the first semiconductor structure is spaced apart from the first region in the second direction.

3. The vertical memory device of claim 2, further comprising a plurality of remaining sacrificial layer patterns that are at a same level as the plurality of gate electrodes respectively,
   wherein a length of each remaining sacrificial layer pattern in a third direction that is substantially perpendicular to the first direction and the second direction gradually decreases, as a level of each remaining sacrificial layer pattern gets higher.

4. The vertical memory device of claim 3, further comprising a second semiconductor structure in the second region and that is spaced apart from the first region in the third direction,
   wherein a lowermost one of the remaining sacrificial layer patterns covers the second semiconductor structure.

5. The vertical memory device of claim 3, wherein a thickness of the lowermost one of the remaining sacrificial layer patterns is substantially identical to the thickness of the protection layer pattern.

6. The vertical memory device of claim 3, wherein the lowermost one of the remaining sacrificial layer patterns and the protection layer pattern include a same material.

7. The vertical memory device of claim 3, further comprising a second semiconductor structure in the second region and that is spaced apart from the first region in the third direction,
wherein the protection layer pattern substantially covers the second semiconductor structure.

8. The vertical memory device of claim 7, wherein the remaining sacrificial layer pattern and the protection layer pattern are spaced apart from each other in the third direction.

9. The vertical memory device of claim 3, further comprising an insulation layer pattern between adjacent ones of the gate electrodes,
wherein the adjacent ones of the gate electrodes are spaced apart from each other in the third direction.

10. The vertical memory device of claim 9, wherein a length of the insulation layer pattern in the second direction is greater than a length of the lowermost one of the gate electrodes in the second direction.

11. A method of manufacturing a vertical memory device, the method comprising:
forming a first semiconductor structure on a substrate including a first region and a second region, the first semiconductor structure being in the second region;
forming a plurality of sacrificial layers and a plurality of insulating interlayers on the substrate alternately and repeatedly;
partially removing the sacrificial layers and the insulating interlayers to form a mold structure in the first region and the second region and a protection layer pattern in the second region simultaneously, the protection layer pattern covering the first semiconductor structure;
forming a plurality of holes through the sacrificial layers and the insulating interlayers to expose a top surface of the substrate in the first region;
forming a charge storage structure and a channel filling each of the holes;
partially removing the sacrificial layers to form a plurality of gaps exposing a sidewall of each charge storage structure; and
forming a gate electrode to fill each of the gaps.

12. The method of manufacturing a vertical memory device of claim 11, after forming the charge storage structure and the channel, further comprising partially removing the insulating interlayers and the sacrificial layers to form an opening extending in a second direction that is substantially parallel to a top surface of the substrate.

13. The method of manufacturing a vertical memory device of claim 12, wherein partially removing the sacrificial layers includes forming remaining sacrificial layer patterns in the second region, and
wherein a lowermost one of the remaining sacrificial layer patterns and the protection layer pattern are spaced apart from each other in the second direction.

14. The method of manufacturing a vertical memory device of claim 13, before forming a plurality of sacrificial layers and a plurality of insulating interlayers, further comprising forming a second semiconductor structure in the second region on the substrate,
wherein the first semiconductor structure is spaced apart from the first region in the second direction, the second semiconductor structure is spaced apart from the first region in a third direction that is substantially perpendicular to the first direction and the second direction, and
wherein the lowermost one of the remaining sacrificial layer patterns substantially covers the second semiconductor device.

15. The method of manufacturing a vertical memory device of claim 13, before forming a plurality of sacrificial layers and a plurality of insulating interlayers, further comprising forming a second semiconductor device in the second region on the substrate,
wherein the first semiconductor device is spaced apart from the first region in the second direction, the second semiconductor device is spaced apart from the first region in a third direction that is substantially perpendicular to the first direction and the second direction, and
wherein the protection layer pattern substantially covers the second semiconductor device.

16. A vertical memory device, comprising:
a substrate including a first region, a second region and a third region;
a first semiconductor structure in the second region;
a second semiconductor structure in the third region;
a charge storage structure on a sidewall of ones of a plurality of channels in the first region;
a plurality of gate electrodes arranged on a sidewall of the charge storage structure and spaced apart from each other in a first direction that is substantially perpendicular to a top surface of the substrate;
a plurality of remaining sacrificial layer patterns that are at a same level as the plurality of gate electrodes, respectively, wherein a lowermost one of the plurality of remaining sacrificial layer patterns substantially covers the second semiconductor; and
a protection layer pattern substantially covering the first semiconductor structure, the protection layer pattern having a thickness that is substantially similar to a thickness of a lowermost gate electrode.

17. The vertical memory device of claim 16, wherein a length of each of the remaining sacrificial layer patterns in a third direction that is substantially perpendicular to the first direction and the second direction gradually decreases, as a level of each of the remaining sacrificial layer pattern gets higher.

18. The vertical memory device of claim 16, wherein the gate electrodes extend in a second direction that is substantially parallel to the top surface of the substrate,
wherein the lowermost one of the gate electrodes and the protection layer pattern are spaced apart from each other in the second direction,
wherein the first semiconductor structure is spaced apart from the first region in the second direction, and
wherein the second semiconductor structure is spaced apart from the first region in a third direction that is substantially perpendicular to the first direction and the second direction.

19. The vertical memory device of claim 18, wherein the lowermost one of the remaining sacrificial layer patterns and the protection layer pattern are spaced apart from each other in a third direction that is substantially perpendicular to the first direction and the second direction, and
wherein adjacent ones of the plurality of gate electrodes are spaced apart from each other in the third direction.

20. The vertical memory device of claim 16, wherein a thickness of the lowermost remaining sacrificial layer pattern is substantially identical to a thickness of the protection layer pattern, and
   wherein the lowermost one of the remaining sacrificial layer patterns and the protection layer pattern include a same material.

* * * * *